United States Patent
Koshio et al.

(10) Patent No.: US 10,848,035 B2
(45) Date of Patent: Nov. 24, 2020

(54) CONTROL APPARATUS THAT CONTROLS DRIVING OF A DRIVEN BODY

(71) Applicant: Mitsuba Corporation, Kiryu-shi, Gunma (JP)

(72) Inventors: Fumiaki Koshio, Kiryu (JP); Takahiko Ogane, Kiryu (JP); Wataru Kusumoto, Kiryu (JP); Masamichi Ishii, Kiryu (JP)

(73) Assignee: Mitsuba Corporation, Gunma (JP)

( * ) Notice: Subject to any disclaimer, the term of this patent is extended or adjusted under 35 U.S.C. 154(b) by 576 days.

(21) Appl. No.: 15/560,199

(22) PCT Filed: May 27, 2016

(86) PCT No.: PCT/JP2016/065733
§ 371 (c)(1),
(2) Date: Sep. 21, 2017

(87) PCT Pub. No.: WO2016/194815
PCT Pub. Date: Dec. 8, 2016

(65) Prior Publication Data
US 2018/0076695 A1    Mar. 15, 2018

(30) Foreign Application Priority Data
May 29, 2015    (JP) .................................. 2015-110918

(51) Int. Cl.
*H02K 11/00*    (2016.01)
*H02K 11/33*    (2016.01)
(Continued)

(52) U.S. Cl.
CPC ............. *H02K 11/33* (2016.01); *H02K 11/30* (2016.01); *H02P 6/28* (2016.02); *H05K 3/32* (2013.01);
(Continued)

(58) Field of Classification Search
CPC ........ H02K 11/02; H02K 11/30; H02K 11/33; H02K 29/08; H02K 5/225; H02K 9/22; H02P 29/00; H05K 3/03
See application file for complete search history.

(56) References Cited

U.S. PATENT DOCUMENTS

2006/0006749 A1*  1/2006  Sasaki ................. B62D 5/0406
                                                    310/68 R
2007/0002594 A1*  1/2007  Otsuka ................. H02M 7/003
                                                    363/37
(Continued)

FOREIGN PATENT DOCUMENTS

CN        104578512 A      4/2015
EP         1990897 A1     11/2008
(Continued)

OTHER PUBLICATIONS

European Patent Office, Search Report issued in corresponding EP 16803250.6 dated Nov. 14, 2018, 16 pages.
(Continued)

*Primary Examiner* — Muhammad S Islam
(74) *Attorney, Agent, or Firm* — Wood Herron & Evans LLP

(57) ABSTRACT

A control apparatus includes a terminal that includes a plurality of electrically conductive plate materials, a base member on which the terminal is provided, and an electronic component that includes a plurality of electronic elements which are electrically connected to the terminal, wherein a window part from which part of the terminal is exposed is formed on the base member so as to penetrate in a thickness direction of the base member, and an extension electronic component arrangement part is provided on the base member, and wherein the electronic component is electrically connected to the terminal that is exposed from the window part, and an electronic component is electrically connectable
(Continued)

selectively between a plurality of bus bars by the extension electronic component arrangement part.

11 Claims, 13 Drawing Sheets

(51) Int. Cl.
*H05K 3/32* (2006.01)
*H02K 11/30* (2016.01)
*H02P 6/28* (2016.01)
*H02K 29/08* (2006.01)
*H02K 11/02* (2016.01)
*H02K 5/22* (2006.01)
*H02K 9/22* (2006.01)

(52) U.S. Cl.
CPC .............. *H02K 5/225* (2013.01); *H02K 9/22* (2013.01); *H02K 11/02* (2013.01); *H02K 29/08* (2013.01)

(56) References Cited

U.S. PATENT DOCUMENTS

2013/0028765 A1   1/2013   Yokozawa et al.
2013/0328424 A1   12/2013  Goto

FOREIGN PATENT DOCUMENTS

| | | |
|---|---|---|
| JP | 2011223644 A | 11/2011 |
| JP | 2014054017 A | 3/2014 |
| JP | 2014161209 A | 9/2014 |
| WO | 2014104121 A1 | 7/2014 |

OTHER PUBLICATIONS

European Patent Office, Search Report issued in corresponding EP 16803250.6 dated Dec. 17, 2018, 14 pages.
Chinese Patent Office, Office Action issued in CN 201680030645.7 dated Nov. 5, 2019, 13 pages.
PCT Office, International Search Report issued in PCT/JP2016/065733 dated Aug. 30, 2016, 3 pages.

\* cited by examiner

CONTROL APPARATUS THAT CONTROLS DRIVING OF A DRIVEN BODY

TECHNICAL FIELD

The present invention relates to a control apparatus. Priority is claimed on Japanese Patent Application No. 2015-110918 filed on May 29, 2015, the contents of which are incorporated herein by reference.

BACKGROUND

In the related art, as control apparatuses that control driving of a driven body such as a motor, for example, a control apparatus disclosed in Patent Document 1 is known. The control apparatus includes a circuit board to which a plurality of electronic elements are attached.

RELATED ART DOCUMENTS

Patent Documents

[Patent Document 1] Japanese Unexamined Patent Application, First Publication No. 2014-54017

SUMMARY OF INVENTION

Problems to be Solved by the Invention

Although complicated wiring can be easily formed on a circuit board by printing, in many cases, the circuit board is a dedicated design component. Therefore, when specifications of a control are changed, it is necessary to change the circuit board for each of the specifications, and there is a problem in reducing component costs.

Further, wiring by printing has a high degree of freedom of a circuit design; however, soldering between the circuit board and a plurality of electronic elements is required. The rate occupied by a soldering step among all process steps is large, and therefore, there is a problem in shortening a process time.

An object of the present invention is to reduce component costs and shorten a process time while enhancing the degree of design freedom in a control apparatus that controls driving of a driven body.

Means for Solving the Problem

As a means for solving the problem described above, an aspect of the invention described in Claim 1 is a control apparatus, including a terminal that includes a plurality of electrically conductive plate materials, a base member on which the terminal is provided, and an electronic component that includes a plurality of electronic elements which are electrically connected to the terminal, wherein a window part from which part of the terminal is exposed is formed on the base member so as to penetrate in a thickness direction of the base member, and an extension electronic component arrangement part is provided on the base member, and wherein the electronic component is electrically connected to the terminal that is exposed from the window part, and an electronic component is electrically connectable selectively between the terminals by the extension electronic component arrangement part.

An aspect of the invention described in Claim 2 is a control apparatus, further including a power device that supplies electric power to a driven body and that controls driving of the driven body, wherein the terminal includes a first terminal to which the electronic component is electrically connected and a second terminal to which the power device is electrically connected, the window part includes a first window part from which part of the first terminal is exposed and a second window part from which part of the second terminal is exposed, the electronic component is electrically connected to the first terminal that is exposed from the first window part, and the power device is electrically connected to the second terminal that is exposed from the second window part.

An aspect of the invention described in Claim 3 is a control apparatus, wherein the first terminal includes a ground terminal having a ground end terminal, the first window part includes a ground window part from which the ground end terminal is exposed, and a noise prevention element is selectively connectable to the ground terminal.

An aspect of the invention described in Claim 4 is a control apparatus, wherein the electronic component is joined by welding to the terminal that is exposed from the window part.

An aspect of the invention described in Claim 5 is a control apparatus, further including a power device that supplies electric power to a driven body and that controls driving of the driven body, wherein a floating prevention part that prevents the power device from floating from the base member is provided on the base member.

An aspect of the invention described in Claim 6 is a control apparatus, wherein a latch part that latches the power device to the base member is provided on the floating prevention part.

An aspect of the invention described in Claim 7 is a control apparatus, wherein the latch part includes a base unit that is provided on a first surface side of the base member, a leg unit that extends from the base unit toward a second surface side which is an opposite side of the first surface side of the base member, and a claw unit that protrudes from an end portion of the leg unit toward the power device which is arranged on the second surface side and that latches the power device.

An aspect of the invention described in Claim 8 is a control apparatus, further including a housing that is attached to the base member and that has a higher thermal conductivity than that of the base member.

An aspect of the invention described in Claim 9 is a control apparatus, wherein the plurality of electronic elements include a first electronic element and a second electronic element having a higher heat emission property than that of the first electronic element, a recess part that is recessed at a position which faces at least the second electronic element of the first electronic element and the second electronic element is formed on the housing, a thermally conductive material having a higher thermal conductivity than that of the base member is provided on the recess part, and the housing is fixed to the base member via the thermally conductive material that is provided on the recess part.

An aspect of the invention described in Claim 10 is a control apparatus, further including a power device that supplies electric power to a driven body and that controls driving of the driven body, wherein the recess part includes a first recess part that is recessed at a position which faces at least the second electronic element of the first electronic element and the second electronic element and a second recess part that is recessed at a position which faces the power device, and the thermally conductive material includes a first thermally conductive material that is provided on the first recess part and a second thermally conductive material that is provided on the second recess part.

An aspect of the invention described in Claim 11 is a control apparatus, wherein the housing includes a motor connection part to which a motor as a driven body is integrally connected.

Advantage of the Invention

According to the aspect of the invention described in Claim 1, the window part from which part of the terminal is exposed is formed on the base member on which the terminal is provided. In this case, it is possible to connect an electronic component selectively to a predetermined terminal that is exposed from the window part. Further, an electronic component is electrically connectable selectively between the terminals by the extension electronic component arrangement part. In this case, it is possible to respond to a toughness requirement such as noise that is required for the control apparatus by appropriately adding an electronic component. Accordingly, it is possible to enhance the degree of design freedom. Further, the electronic component is electrically connected to the terminal that is exposed from the window part. In this case, the configuration requires no circuit board, and therefore, even when specifications of a control are changed, it is not necessary to change a circuit board for each of the specifications compared to a case where a circuit board is provided. Accordingly, it is possible to reduce component costs. Further, the window part is formed so as to penetrate in the thickness direction of the base member. In this case, a connection apparatus such as a resistance welder is easily inserted through the window part, and therefore, even when the rate occupied by a connection step between the terminal and the electronic component among all process steps is large, it is possible to shorten a process time. Accordingly, it is possible to reduce component costs and shorten a process time while enhancing the degree of design freedom.

According to the aspect of the invention described in Claim 2, the electronic component is electrically connected to the first terminal that is exposed from the first window part, and the power device is electrically connected to the second terminal that is exposed from the second window part. In this case, it is possible to arrange the electronic component and the power device collectively, and therefore, it is possible to effectively reduce component costs and shorten a process time while enhancing the degree of design freedom.

According to the aspect of the invention described in Claim 3, the noise prevention element is selectively connectable to the ground terminal. In this case, it is possible to arrange the noise prevention element depending on the specification, and therefore, even when a countermeasure against noise is required, it is possible to satisfy the noise requirement.

According to the aspect of the invention described in Claim 4, the electronic component is joined by welding to the terminal that is exposed from the window part. In this case, it is possible to effectively shorten a process time compared to a case where the electronic component is soldered.

According to the aspect of the invention described in Claim 5, the floating prevention part that prevents the power device from floating from the base member is provided on the base member. In this case, it is possible to securely fix the power device to the base member. For example, even when the power device is joined by welding to the second terminal that is exposed from the second window part, it is possible to prevent the power device from floating from the base member.

According to the aspect of the invention described in Claim 6, the latch part that latches the power device to the base member is provided on the base member. In this case, compared to a case where a fastening member such as a bolt is used, it is possible to easily latch the power device to the base member, and therefore, it is possible to reduce man-hours for attachment.

According to the aspect of the invention described in Claim 7, the latch part includes the base unit that is provided on the first surface side of the base member, the leg unit that extends from the base unit toward the second surface side which is the opposite side of the first surface side of the base member, and the claw unit that protrudes from the end portion of the leg unit toward the power device arranged on the second surface side and that latches the power device. In this case, by hanging the claw unit on the power device while using deflection of the leg unit, it is possible to easily latch the power device to the base member. Further, the leg unit extends from the base unit on the first surface side of the base member toward the second surface side, and thereby, it is possible to sufficiently ensure the length of the leg unit by using the thickness of the base member. Accordingly, it is possible to effectively carry out the operation of deflection of the leg unit.

According to the aspect of the invention described in Claim 8, the housing that is attached to the base member and that has a higher thermal conductivity than that of the base member is further included. In this case, it is possible to enhance a heat release property by a simple configuration compared to a case where a cooling apparatus is separately provided.

According to the aspect of the invention described in Claim 9, the recess part that is recessed at a position which faces at least the second electronic element is formed on the housing, and the housing is fixed to the base member via the thermally conductive material that is provided on the recess part. In this case, even when the second electronic element excessively emits heat, it is possible to effectively release the heat from the second electronic element.

According to the aspect of the invention described in Claim 10, the recess part includes the first recess part that is recessed at a position which faces at least the second electronic element and the second recess part that is recessed at a position which faces the power device, and the thermally conductive material includes the first thermally conductive material that is provided on the first recess part and the second thermally conductive material that is provided on the second recess part. In this case, even when the second electronic element and the power device excessively emit heat, it is possible to effectively release the heat from the second electronic element and the power device.

According to the aspect of the invention described in Claim 11, the housing includes the motor connection part to which the motor as the driven body is integrally connected. In this case, it is possible to reduce component costs and shorten a process time while enhancing the degree of design freedom in a configuration in which the control apparatus and the motor are integrated.

DESCRIPTION OF THE EMBODIMENTS

Hereinafter, an embodiment of the present invention is described with reference to the drawings.

<Entire Electric Motor>

Figure 1:
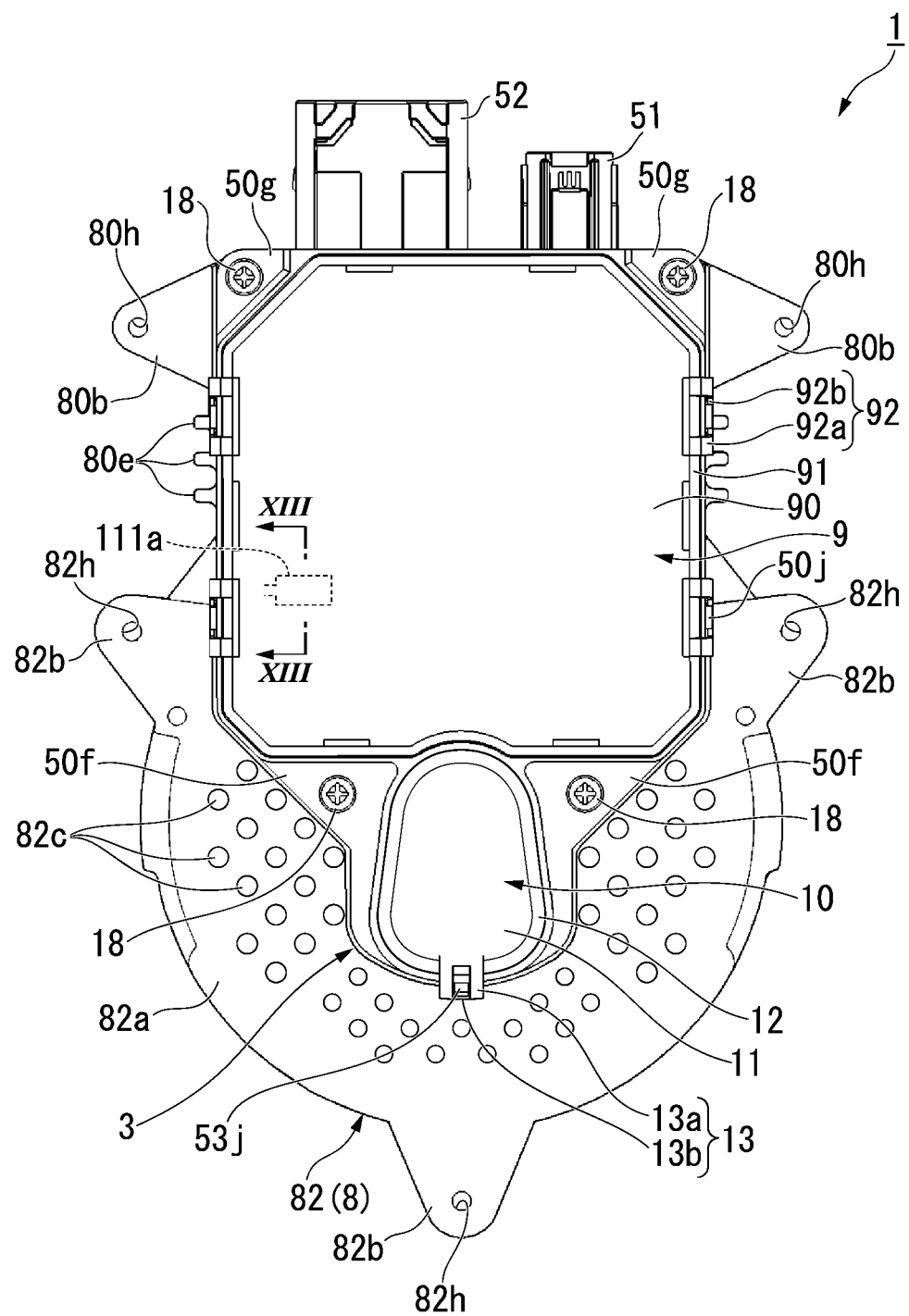
FIG. 1 is a view of an electric motor that includes a control apparatus according to an embodiment of the present invention seen from one side in a motor axial direction.
Figure 2:
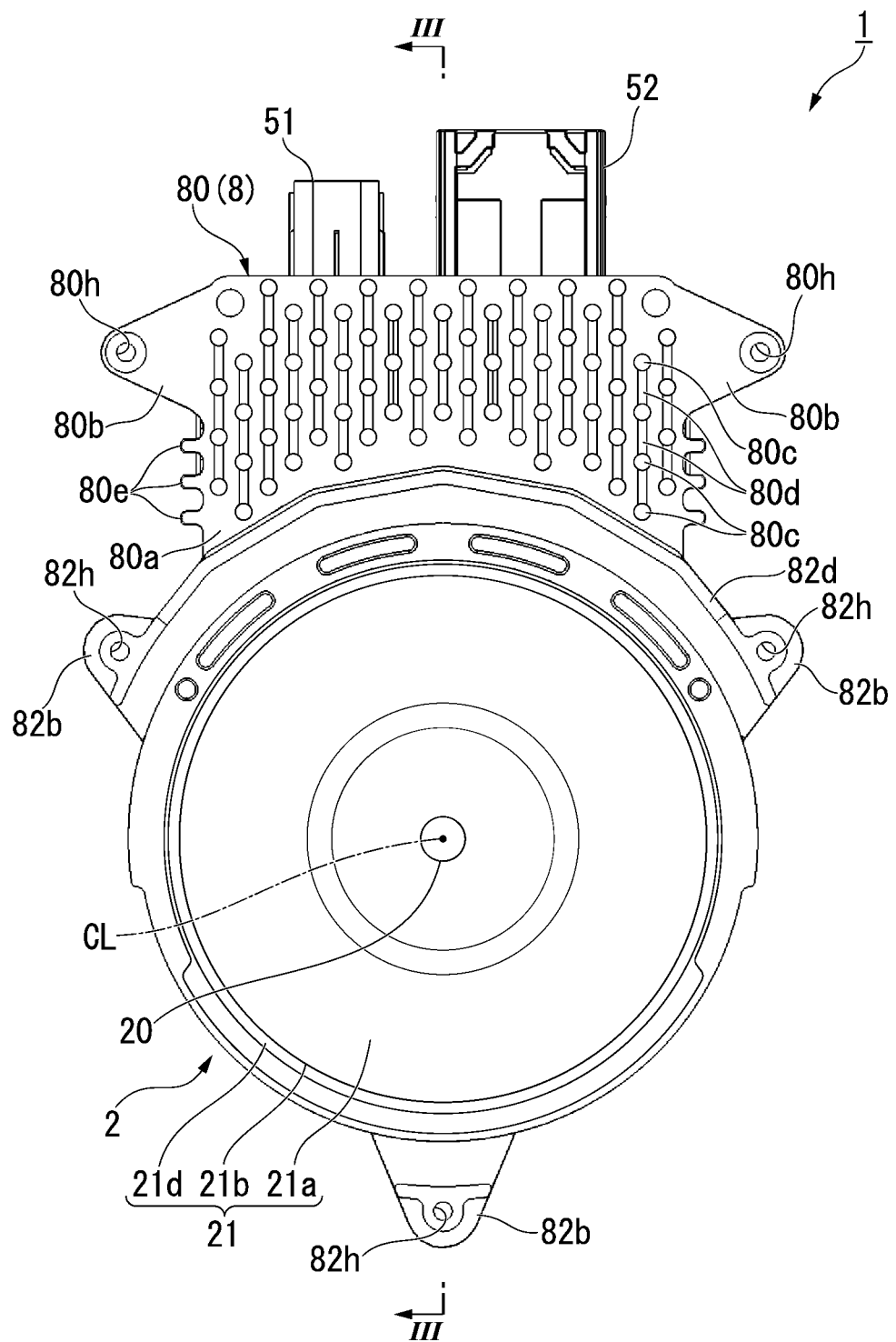
FIG. 2 is a view of the electric motor seen from the other side in the motor axial direction.
Figure 3:
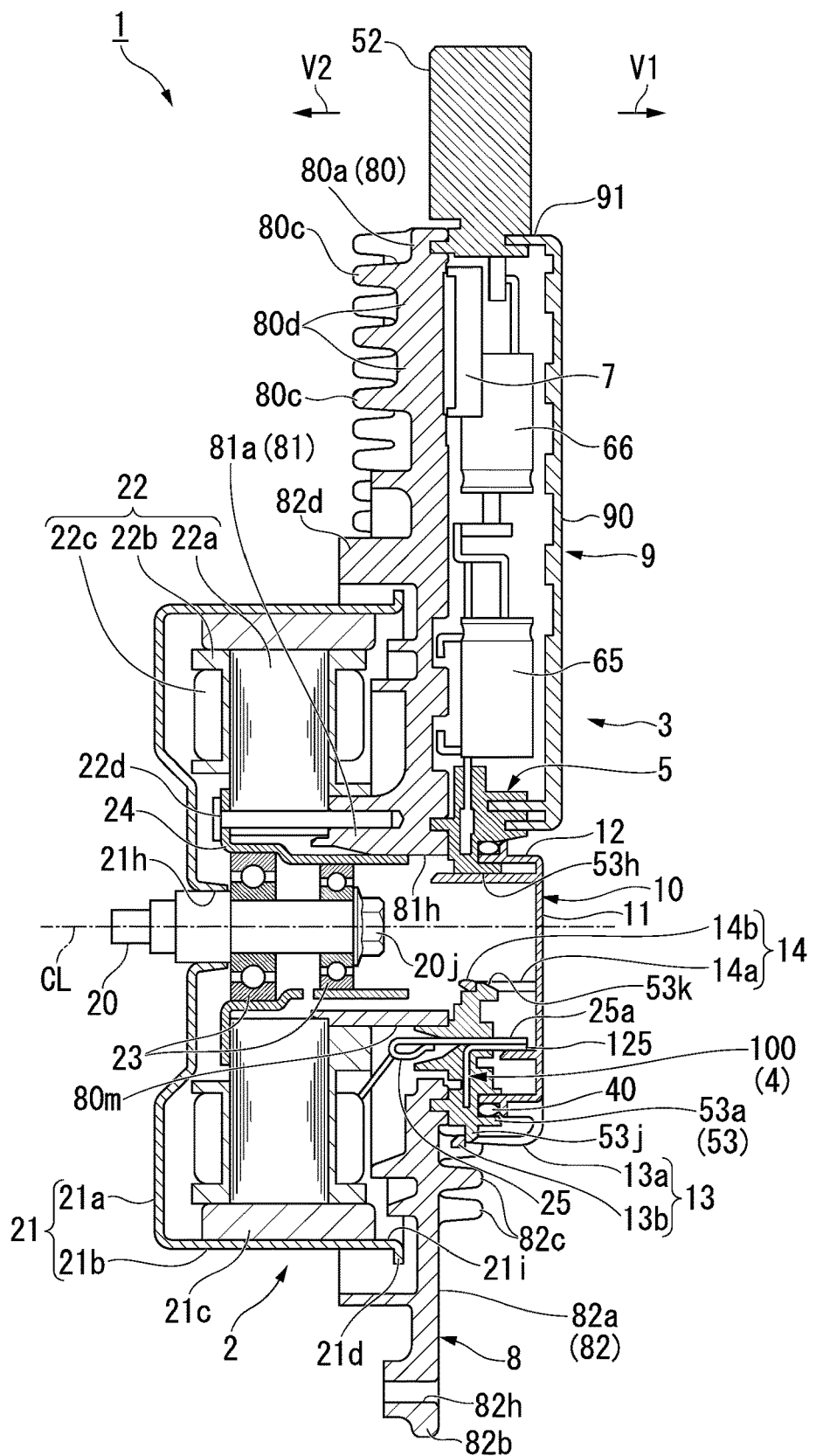
FIG. 3 is a III-III cross-sectional view of FIG. 2.

FIG. 1 is a view of an electric motor 1 that includes a control apparatus 3 according to an embodiment of the present invention seen from one side in a motor axial direction. FIG. 2 is a view of the electric motor 1 seen from the other side in the motor axial direction. FIG. 3 is a cross-sectional view of FIG. 2.

Hereinafter, an example of the electric motor 1 that includes the control apparatus 3 according to the embodiment is shown with reference to FIG. 1 to FIG. 3.

The electric motor 1 includes a brushless motor 2 (driven body) and the control apparatus 3 that controls the brushless motor 2.

Reference numeral CL in the drawing represents an axial line of an output shaft 20 of the brushless motor 2. In the following description, a direction along the axial line CL is referred to as a "motor axial direction", a direction that is orthogonal to the axial line CL is referred to as a "motor radial direction", and a circumferential direction around the axial line CL is referred to as a "motor circumferential direction", In the drawing, reference numeral V1 represents one side of the motor axial direction, and reference numeral V2 represents the other side of the motor axial direction.

<Brushless Motor>

The brushless motor is described with reference to FIG. 2 and FIG. 3. The brushless motor 2 includes the output shaft 20 that forms the axial line CL, a rotor 21 that is rotatable together with the output shaft 20, and a stator 22 that is capable of generating a magnetic field for rotating the rotor 21 together with the output shaft 20.

The rotor 21 includes: a bottom wall 21a having a disc shape; a circumferential wall 21b that has a cylindrical shape, that extends from an outer circumferential end of the bottom wall 21a to one side V1 in the motor axial direction, and that forms an opening part 21i on the one side V1 in the motor axial direction; and a flange part 21d that is arranged on an end part on the opening part 21i side of the circumferential wall 21b and that extends in the radial direction. A boss part 21h which has a cylindrical shape and through which the output shaft 20 is inserted is formed on a center part in the radial direction of the bottom wall 21a. For example, the output shaft 20 is pressed into the boss part 21h to be fixed, and thereby, the rotor 21 is rotatable together with the output shaft 20. A plurality of rotor magnets 21c are provided on an inner side surface in the radial direction of the circumferential wall 21b by adhesion or the like. The rotor 21 is rotatable together with the output shaft 20 in response to a magnetic field that is generated by the stator 22.

The stator 22 is arranged on an inner side in the radial direction of the circumferential wall 21b of the rotor 21. The stator 22 is fixed to a housing 8 of the control apparatus 3 by a bolt 22d. A bearing holder 24 to which a pair of bearings 23 that function as a bearing of the output shaft 20 are fitted is provided on an inner side in the radial direction of the stator 22 and is fixed together with the stator 22 by the bolt 22d.

The stator 22 includes a stator core 22a having a cylindrical shape, an insulator 22b that has an insulation property and that is attached to both sides in the motor axial direction of a plurality of teeth parts that are provided on the stator core 22a so as to protrude toward an outward direction in the radial direction, and a coil 22c that is provided on and wound around the insulator 22b and that has an electrically conductive property. The coil 22c corresponds to three phases that are a U phase, a V phase, and a W phase. The brushless motor 2 of the present embodiment is a three-phase brushless motor that includes the three-phase coil 22c of the U-phase, the V-phase, and the W-phase.

An end part of the coil 22c is connected to a bus bar unit 25 that is drawn from the opening part 21i side of the rotor 21 and that is arranged on the opening part 21i side so as to penetrate through an opening 80m of the housing 8. The bus bar unit 25 has a function of supplying electric power from the external to the coil 22c. For example, the bus bar unit 25 includes: a U-phase bus bar, a V-phase bus bar, and a W-phase bus bar (hereinafter, also referred to as "U-phase to W-phase bus bars") that are connected to a winding start end (not shown) of the coil 22c of each phase; and also a neutral point bus bar that is connected to a winding finish end (not shown) of the coil 22c of each phase. The U-phase to W-phase bus bars of the above bus bars include three power supply terminals 25a that extend along the motor axial direction toward the control apparatus 3 from the opening part 21i. Each of the power supply terminals 25a is electrically connected to a motor side end part 125 (refer to FIG. 7) of three-phase bus bars 121 to 123 described below by resistance welding or the like.

<Control Apparatus>

Figure 4:
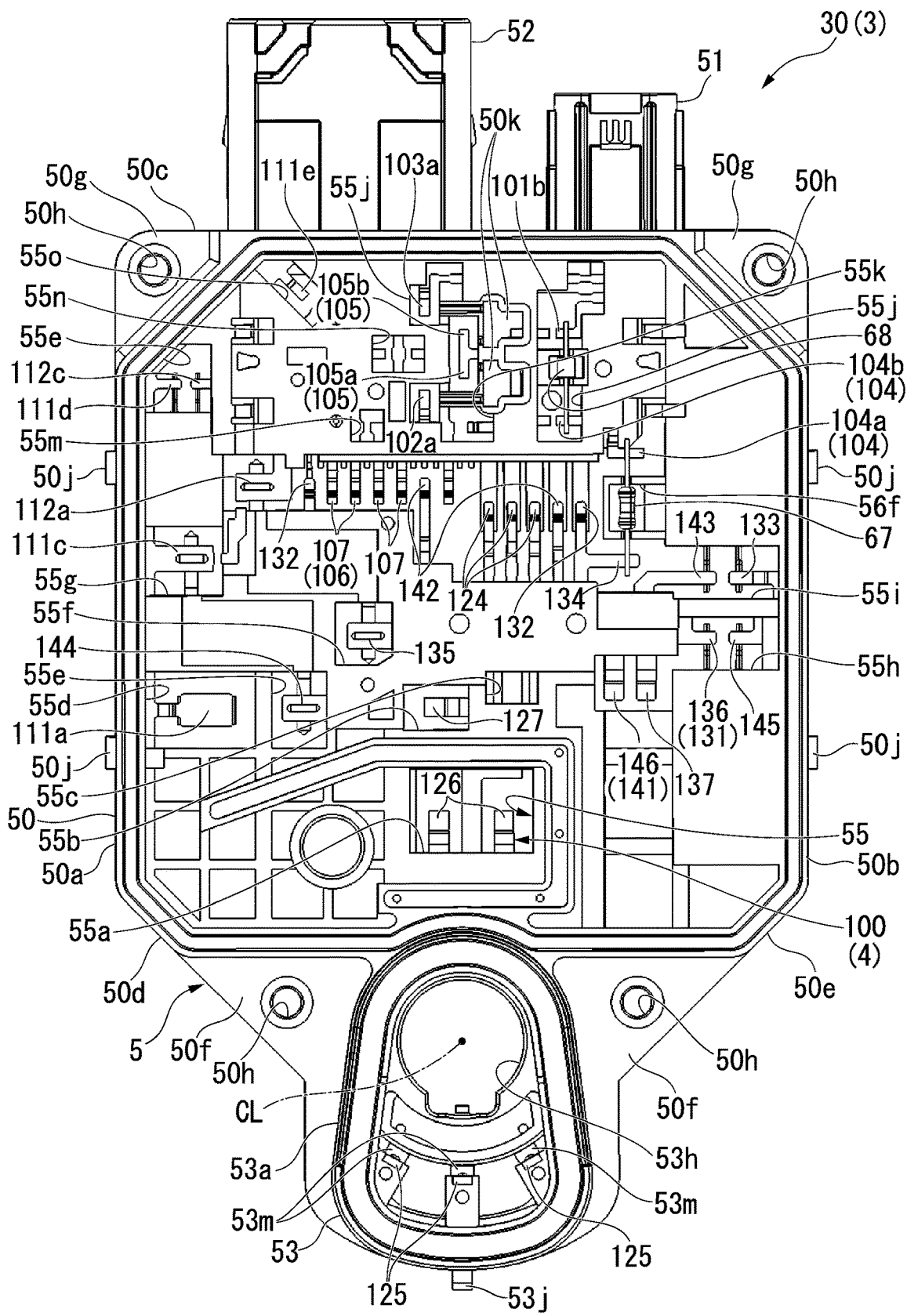
FIG. 4 is a view of a bus bar module in the control apparatus seen from a first surface side of a base member.
Figure 5:
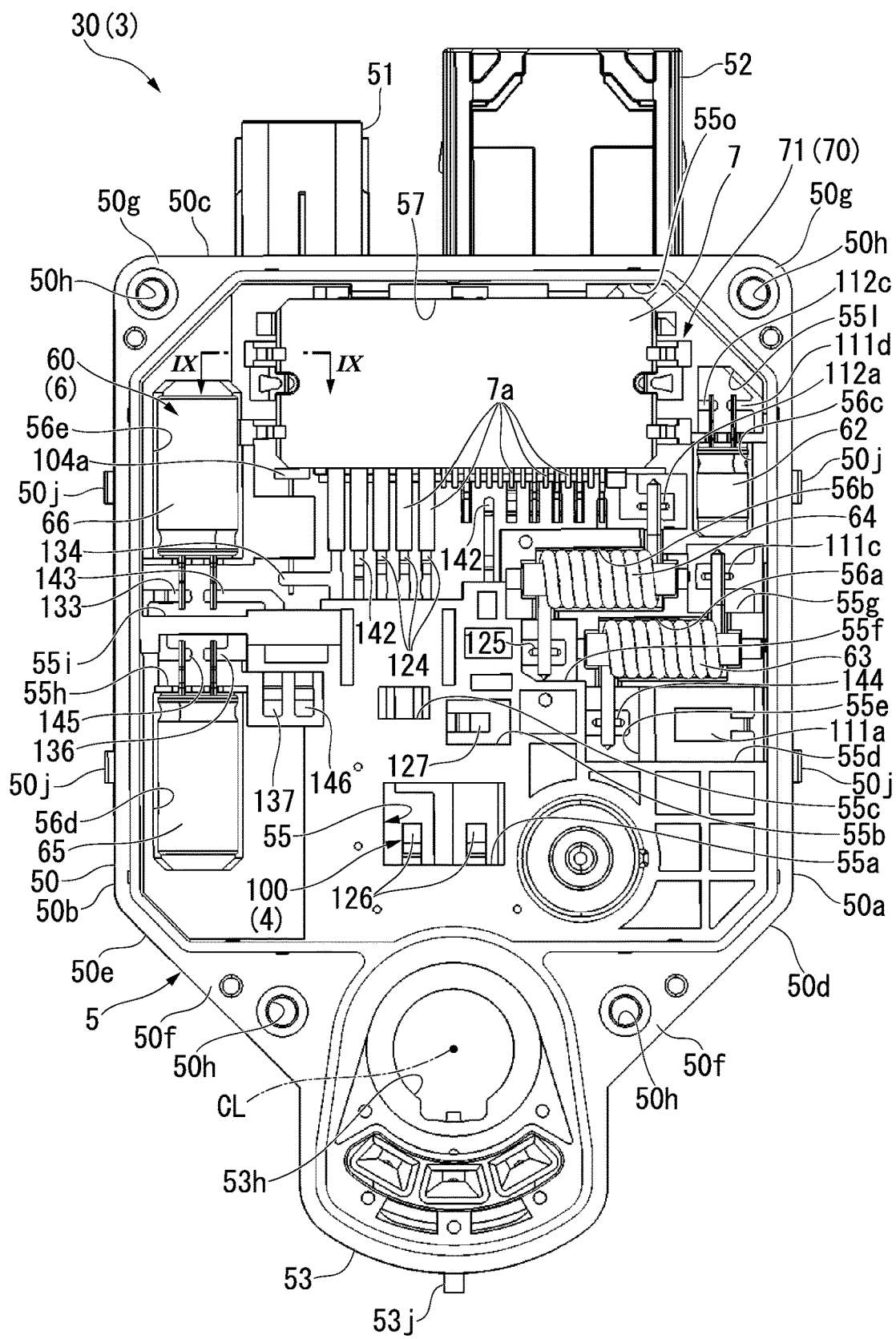
FIG. 5 is a view of the bus bar module seen from a second surface side of the base member.

FIG. 4 is a view of a bus bar module 30 in the control apparatus 3 seen from a first surface side of a base member 5. FIG. 5 is a view of the bus bar module 30 seen from a second surface side of the base member 5. One side in a thickness direction of the base member 5 is the "first surface side", and an opposite side of the first surface side of the base member 5 is the "second surface side". The "first surface side" corresponds to the one side (V1 side) in the motor axial direction in the base member 5, and the "second surface side" corresponds to the other side (V2 side) in the motor axial direction in the base member 5. For ease of understanding, in FIG. 4 and FIG. 5, the housing 8, a main body cover 9, and a terminal cover 10 are not shown.

The following description refers to FIG. 4 and FIG. 5. The control apparatus 3 includes: a terminal 4 that includes a plurality of bus bars 100 (electrically conductive plate materials); the base member 5 which is made of a plastic and in which the terminal 4 is buried; an electronic component 6 that includes a plurality of electronic elements 60 each of which is electrically connected to each of the plurality of bus bars 100; a power device 7 that supplies electric power to the brushless motor 2 and that controls driving of the brushless motor 2; the housing 8 (shown in FIG. 3) to which the base member 5 is attached; and the main body cover 9 and the terminal cover 10 (shown in FIG. 3) which cover the base member 5 and which are made of a plastic.

A terminal that electrically connects the electronic component 6 among the terminals 4 corresponds to a "first terminal" described in claims. A terminal that electrically connects the power device 7 among the terminals 4 corresponds to a "second terminal" described in claims.

The bus bar module 30 in the drawing shows part of the control apparatus 3 excluding the housing 8, the main body cover 9, and the terminal cover 10. That is, the bus bar module 30 is an insert molding component in which the plurality of bus bars 100 are arranged inside the base member 5.

<Base Member>

Figure 6:
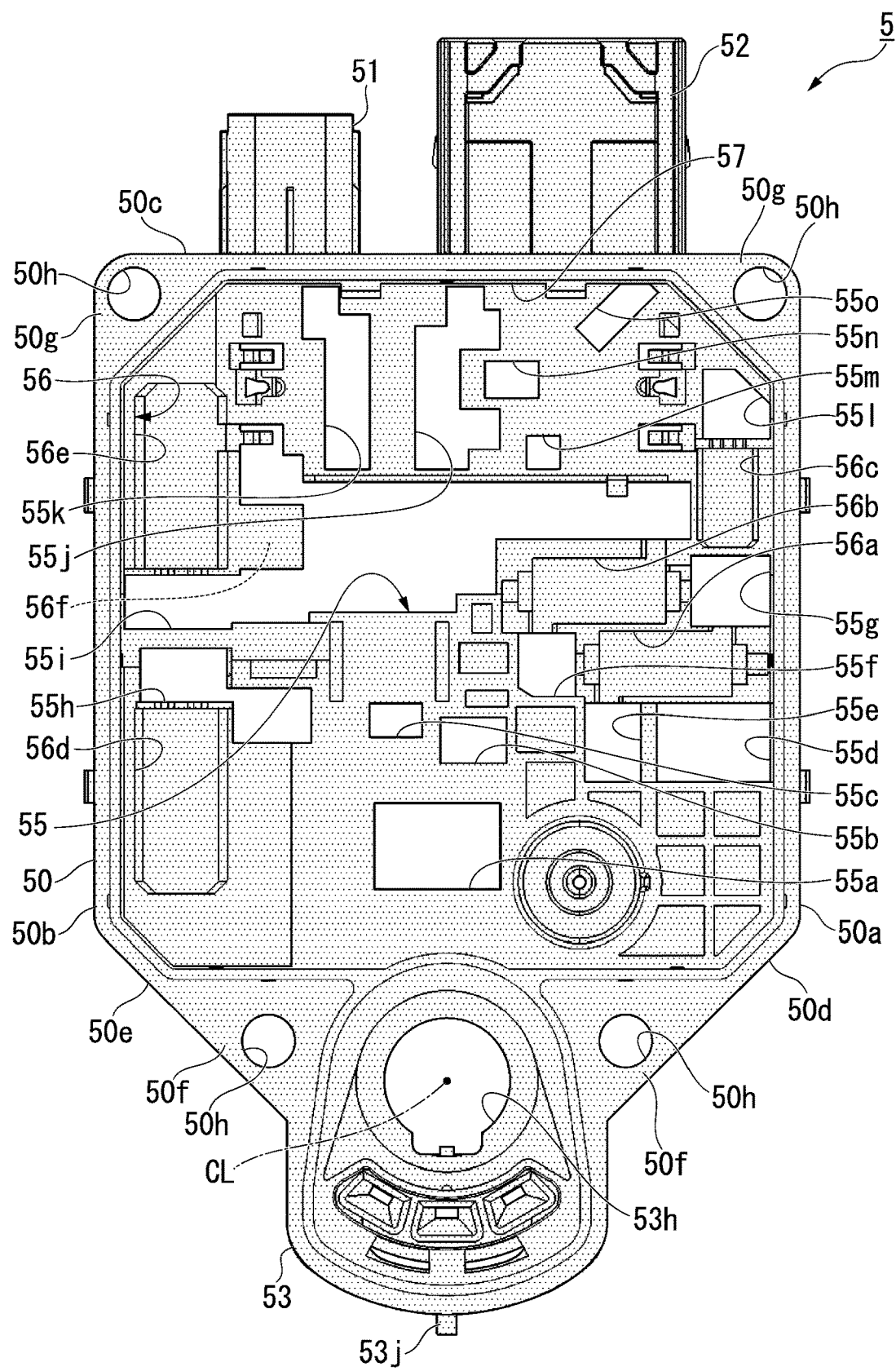
FIG. 6 is a view of the base member seen from the second surface side.

The following description refers to FIG. 6. The base member 5 includes a base main body 50 that has a thickness in the motor axial direction and that forms a rectangular plate shape in plan view seen from the motor axial direction. In plan view, the base main body 50 has a first side 50a, a second side 50b that is opposed to the first side 50a, a third side 50c that is orthogonal to the first side 50a and the second side 50b, a fourth side 50d that is adjacent to the first side 50a and that is slanted, and a fifth side 50e that is opposed to the fourth side 50d in a right-to-left direction in the drawing, that is adjacent to the second side 50b, and that is slanted.

In FIG. 6, for ease of understanding, a main body part of the base member 5 excluding openings such as a window part 55, a through-hole 50h, and an opening part 53h is shown by hatching (dot).

The base member 5 further includes a first connector 51 and a second connector 52 that protrude from the third side 50c of the base main body 50 and a terminal connection part 53 that protrudes from an opposite side of the third side 50c of the base main body 50 in plan view. For example, the plurality of bus bars 100 (refer to FIG. 7) are provided on the base member 5. The plurality of bus bars 100 are buried inside the base member 5, for example, by insert molding using an insulation material such as a resin.

A flange part 50f having an outline that extends along the fourth side 50d and along the fifth side 50e and that extends along an outer circumferential portion of the terminal connection part 53 in plan view is formed between the base main body 50 and the terminal connection part 53.

A flange part 50g that forms a triangular shape and that has a rounded corner at a top portion in plan view is formed on corner parts, at which the first side 50a is crossed with the third side 50c and at which the second side 50b is crossed with the third side 50c, of the base main body 50.

The through-hole 50h that opens in the thickness direction of the base member 5 is formed on the flange parts 50f, 50g.

The opening part 53h that opens in the thickness direction of the base member 5 and three terminal connection holes 53m (refer to FIG. 4) are formed on the terminal connection part 53 at a position facing the output shaft 20. The terminal connection hole 53m guides the three power supply terminals 25a of the brushless motor 2 into the terminal connection part 53, and the three power supply terminals 25a are electrically welded with end parts 125 on a motor side of the three-phase bus bars 121 to 123 described below in a state where surfaces of the three power supply terminals 25a and surfaces of the three-phase bus bars 121 to 123 are butted with each other.

The window part 55 from which a connection part between the electronic component 6 and the bus bar 100 and a connection part between the power device 7 and the bus bar 100 are exposed, an electronic component arrangement part 56 on which the electronic component 6 is arranged, and a power device arrangement part 57 on which the power device 7 is arranged are formed on the base main body 50.

<Window Part>

The window part 55 is formed so as to penetrate through the base main body 50 in the thickness direction of the base member 5.

The window part 55 includes a plurality of window parts 55a to 55o that are arranged at a predetermined position of the base main body 50.

A window part among the window parts 55 from which the first terminal that electrically connects the electronic component 6 is exposed corresponds to a "first window part" described in claims. A window part among the window parts 55 from which the second terminal that electrically connects the power device 7 is exposed corresponds to a "second window part" described in claims.

The thickness direction of the base member 5 may be simply referred to as a "thickness direction". A height direction, which is orthogonal to the thickness direction and which is parallel with the first side 50a and the second side 50b in plan view, of the base member 5 may be simply referred to as a "height direction". A width direction, which is orthogonal to the thickness direction and which is parallel with the third side 50c in plan view, of the base member 5 may be simply referred to as a "width direction".

The window part 55a forms a rectangular shape that extends in the width direction in plan view and is arranged close to the opening part 53h in the height direction and at a middle portion in the width direction.

The window parts 55b, 55c form a rectangular shape that extends in the width direction in plan view and are arranged at a position closer to the third side 50c than the window part 55a so as to be side by side with each other in the width direction.

The window part 55d forms a rectangular shape that extends in the width direction in plan view and is arranged closer to the first side 50a than the window part 55b.

The window part 55e forms a rectangular shape that extends in the height direction in plan view and is arranged on the window part 55b side of the window part 55d.

The window part 55f forms a rectangular shape in plan view and is arranged closer to the third side 50c than a portion between the window part 55b and the window part 55e.

The window part 55g forms a rectangular shape in plan view and is arranged close to the first side 50a and closer to the third side 50c than the window part 55d.

The window part 55h forms a crank shape that extends in the width direction in plan view and is arranged closer to the second side 50b than the window part 55c.

The window part 55i extends longer than the window part 55h in the width direction so as to arrive at the vicinity of the window part 55g from the second side 50b side in plan view and is arranged closer to the third side 50c than the window part 55h.

The window part 55*j* forms a crank shape that extends in the height direction in plan view and is arranged close to the third side 50*c* and at a middle portion in the width direction.

The window part 55*k* forms a crank shape that extends in the height direction in plan view and is arranged on the second side 50*b* side of the window part 55*j*.

The window part 55*l* forms a triangular shape in plan view and is arranged close to the first side 50*a* and closer to the third side 50*c* than the window part 55*g*.

The window part 55*m* forms a rectangular shape in plan view and is arranged on the first side 50*a* side of the window part 55*j*.

The window part 55*n* forms a rectangular shape that extends in the width direction in plan view and is arranged closer to the third side 50*c* than the window part 55*m* and on the first side 50*a* side of the window part 55*j*.

The window part 55*o* forms a trapezoid shape that extends to be slanted with respect to the width direction in plan view and is arranged close to the second connector 52.

<Electronic Component Arrangement Part>

The electronic component arrangement part 56 is formed, in a recess shape that is recessed inward (toward the second surface side from the first surface side, or toward the first surface side from the second surface side) in the thickness direction, on the base main body 50 so as to accommodate the electronic component 6. The electronic component arrangement part 56 includes six arrangement parts 56*a* to 56*f* (a first arrangement part 56*a*, a second arrangement part 56*b*, a third arrangement part 56*c*, a fourth arrangement part 56*d*, a fifth arrangement part 56*e*, and a sixth arrangement part 56*o* on which the electronic component 6 is arranged.

The first arrangement part 56*a*, the second arrangement part 56*b*, the third arrangement part 56*c*, the fourth arrangement part 56*d*, and the fifth arrangement part 56*e* form a recess shape that is recessed toward the first surface side from the second surface side of the base main body 50. The sixth arrangement part 56*f* (refer to FIG. 4) forms a recess shape that is recessed toward the second surface side from the first surface side of the base main body 50.

The first arrangement part 56*a* forms a rectangular shape that extends in the width direction in plan view and is arranged at a portion that is surrounded by the window parts 55*d* to 55*g*.

The second arrangement part 56*b* forms a rectangular shape that extends in the width direction in plan view and is arranged at a portion that is surrounded by the window parts 55*f*, 55*g*, 55*i* so as to be aligned in the height direction with the first arrangement part 56*a*.

The third arrangement part 56*c* forms a rectangular shape that extends in the height direction in plan view and is arranged along the first side 50*a* at a portion that is surrounded by the window parts 55*g*, 55*i*, 55*l*.

The fourth arrangement part 56*d* forms a rectangular shape that extends in the height direction in plan view and is arranged along the second side 50*b* on the fifth side 50*e* side of the window part 55*h*.

The fifth arrangement part 56*e* forms a rectangular shape that extends in the height direction in plan view and is arranged along the second side 50*b* on the third side 50*c* side of the window part 55*i*.

The sixth arrangement part 56*f* (refer to FIG. 4) forms a rectangular shape that extends in the height direction in plan view and is arranged on the window part 55*i* side of the fifth arrangement part 56*e* at a portion that is surrounded by the window part 55*i*.

<Power Device Arrangement Part>

The power device arrangement part 57 is formed, in a recess shape that is recessed inward (toward the first surface side from the second surface side) in the thickness direction, on the base main body 50 so as to accommodate the power device 7. The power device arrangement part 57 forms a rectangular shape that extends in the width direction in plan view and is arranged along the third side 50*c* so as to include a portion that is overlapped with the window parts 55*j*, 55*k*, 55*m*, 55*n*, 55*o*.

<Bus Bar>

Figure 7:
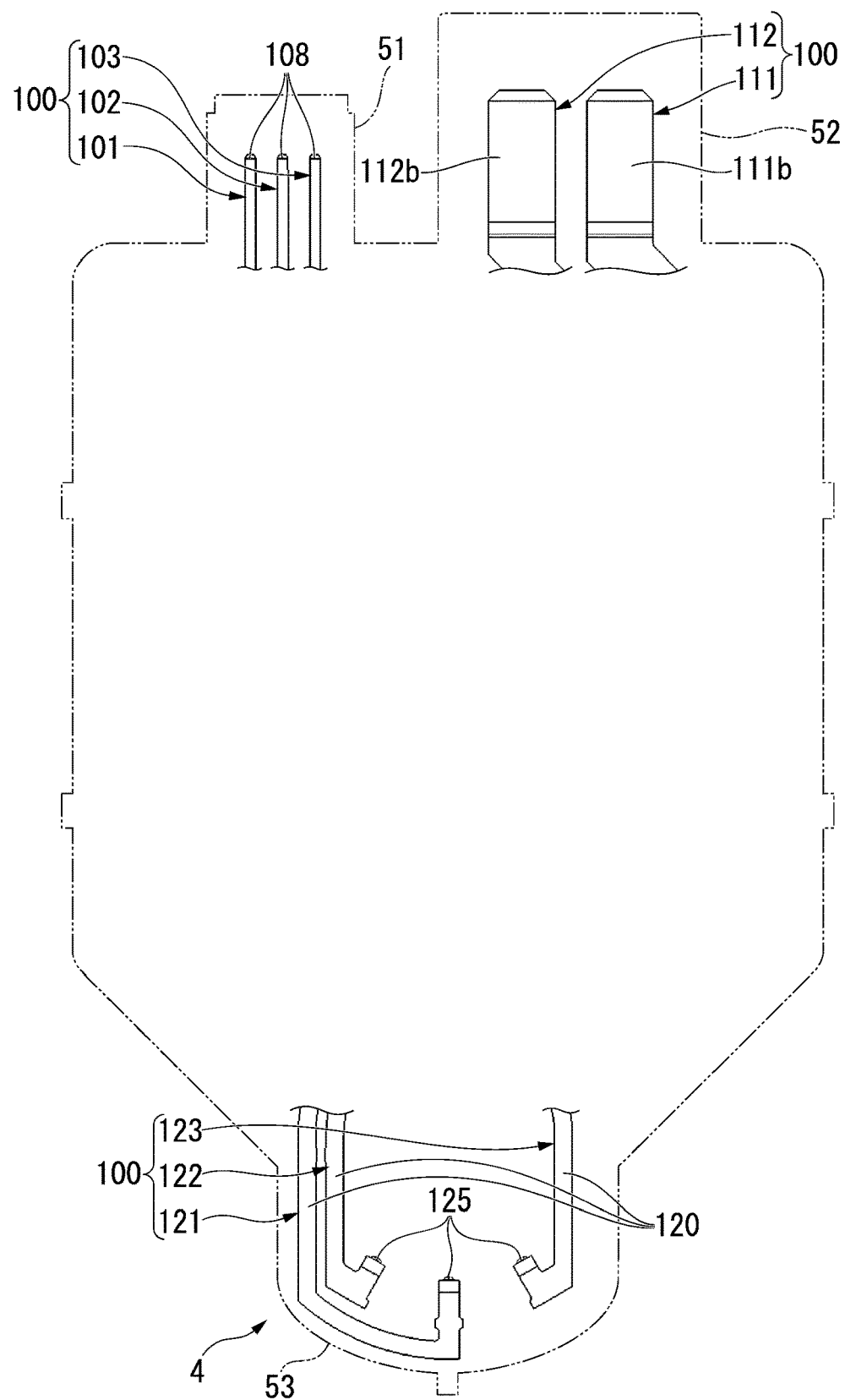
FIG. 7 is a view describing a connection structure between an electronic component and a terminal buried in the base member.

The following description refers to FIG. 7. FIG. 7 is a view describing a connection structure between the electronic component and the terminal buried in the base member.

The plurality of bus bars 100 include signal system terminal bus bars 101 to 106, two power terminal bus bars 111, 112 (a first power terminal bus bar 111 and a second power terminal bus bar 112), three-phase bus bars 121 to 123, a power bus bar 131, and a ground bus bar 141. For example, each of the plurality of bus bars 100 is formed by bending a metal plate material such as copper in a predetermined shape.

The signal system terminal bus bars 101 to 106 are arranged in the vicinity of the first connector 51.

Each of the signal system terminal bus bars 101 to 106 includes a power device side end part 107 that is exposed in the window part 55*i* of the base main body 50, a connector side end part 108 that is exposed in the first connector 51, connection parts 102*a*, 103*a* of the signal system terminal bus bars 102, 103 that are exposed in the window part 55*j*, and connection parts 105*a*, 105*b* of the signal system terminal bus bar 105.

The signal system terminal bus bars 101 to 106 are provided as a communication line to an external apparatus such as an upper level ECU (Electronic Control Unit). For example, the signal system terminal bus bars 101 to 106 are used for inputting a target rotation number of the brushless motor 2, outputting a rotation number of the brushless motor 2, setting a function of the power device 7, and the like.

The first power terminal bus bar 111 is arranged in a region along the first side 50*a* from the second connector 52 of the base main body 50 so as to bypass the first arrangement part 56*a*, the second arrangement part 56*b*, and the third arrangement part 56*c*. The first power terminal bus bar 111 includes a ground end part 111*a* that is exposed in the window part 55*d* of the base main body 50, a connector side end part 111*b* that is exposed in the second connector 52, and tongue piece parts 111*c*, 111*d*, 111*e*, each of which is exposed in each of the window parts 55*g*, 55*l*, 55*o* of the base main body 50 from a portion that connects between the ground end part 111*a* and the connector side end part 111*b*. A noise prevention element 61 is selectively connectable to the first power terminal bus bar 111.

The ground end part 111*a* corresponds to a "ground end terminal" described in claims. The first power terminal bus bar 111 corresponds to a "ground terminal" described in claims. The window part 55*d* corresponds to a "ground window part" described in claims.

The second power terminal bus bar 112 is arranged between the signal system terminal bus bars 101 to 106 and the first power terminal bus bar 111. The second power terminal bus bar 112 includes a tongue piece part 112*a* that is exposed in the window part 55*i* of the base main body 50, a connector side end part 112*b* that is exposed in the second connector 52, and a tongue piece part 112*c* that is exposed in the window part 55*l* of the base main body 50 from a portion that connects between the tongue piece part 112a and the connector side end part 112b.

The three-phase bus bars 121 to 123 are arranged in the vicinity of the terminal connection part 53. Each of the three-phase bus bars 121 to 123 includes a power device side end part 124 that is exposed in the window part 55i of the base main body 50, a motor side end part 125 that is exposed in the three terminal connection holes 53m of the terminal connection part 53, and tongue piece parts 126, 127, each of which is exposed in each of the window parts 55a, 55b of the base main body 50 from a portion that connects between the power device side end part 124 and the motor side end part 125.

Reference numeral 120 in the drawing represents a portion (hereinafter, referred to as a "bus bar main body") that connects between the power device side end part 124 and the motor side end part 125 of the three-phase bus bars 121 to 123. The plate thickness direction of the bus bar main body 120 is substantially parallel with the thickness direction. That is, the plate thickness direction of the bus bar main body 120 is substantially parallel with the motor axial direction. Hereinafter, the plate thickness direction of the bus bar main body 120 is simply referred to as a "plate thickness direction".

The power bus bar 131 is arranged at a position closer to the terminal connection part 53 than the signal system terminal bus bars 101 to 106 and at a position closer to the first surface side (back side in FIG. 7) than the three-phase bus bars 121 to 123 in the thickness direction so as to extend in the width direction. The power bus bar 131 includes a power device side end part 132 and tongue piece parts 133, 134 that are exposed in the window part 55i of the base main body 50, a tongue piece part 135 that is exposed in the window part 55f, and tongue piece parts 136, 137 that are exposed in the window part 55h.

The ground bus bar 141 is arranged at a position closer to the first surface side (back side in FIG. 7) than the power bus bar 131 in the thickness direction so as to extend in the width direction. The ground bus bar 141 includes a power device side end part 142 and a tongue piece part 143 that are exposed in the window part 55i of the base main body 50, a tongue piece part 144 that is exposed in the window part 55e, and tongue piece parts 145, 146 that are exposed in the window part 55h.

<Electronic Element>

The plurality of electronic elements 60 include the noise prevention element 61 (refer to FIG. 8), a pair of smoothing capacitors 65, 66, a resistor 67, and a diode 68.

The noise prevention element 61 includes an X capacitor 62 and two choke coils 63, 64 (a first choke coil 63 and a second choke coil 64).

The X capacitor 62 is provided for suppressing radio noise. For example, the X capacitor 62 is an electrolytic capacitor having a cylindrical shape. The X capacitor 62 is arranged on the third arrangement part 56c of the base main body 50. The center axial line of the X capacitor 62 is arranged along the first side 50a of the base main body 50.

The X capacitor 62 has a pair of lead wires that protrude from one end surface. Each of front ends of the pair of lead wires is arranged in the window part 55l and is electrically connected to each of the tongue piece part 112c of the second power terminal bus bar 112 and the tongue piece part 111d of the first power terminal bus bar 111 exposed from the window part 55l, for example, by resistance welding or the like.

The first choke coil 63 and the second choke coil 64 are provided for suppressing radio noise. For example, the first choke coil 63 and the second choke coil 64 are formed by winding a conductive wire on a core that has a column shape and that is formed of a magnetic material such as a ferrite.

The first choke coil 63 is arranged on the first arrangement part 56a of the base main body 50, and the second choke coil 64 is arranged on the second arrangement part 56b of the base main body 50. The center axial lines of the cores of the first choke coil 63 and the second choke coil 64 are arranged along the width direction.

One end part of a lead wire of the first choke coil 63 is arranged in the window part 55g and is electrically connected to the tongue piece part 111c of the first power terminal bus bar 111 that is exposed from the window part 55g, for example, by resistance welding or the like. The other end part of the lead wire of the first choke coil 63 is arranged in the window part 55e and is electrically connected to the tongue piece part 144 of the ground bus bar 141 that is exposed from the window part 55e, for example, by resistance welding or the like.

One end part of a lead wire of the second choke coil 64 is arranged in the window part 55i and is electrically connected to the tongue piece part 112a of the second power terminal bus bar 112 that is exposed from the window part 55i, for example, by resistance welding or the like. The other end part of the lead wire of the second choke coil 64 is arranged in the window part 55f and is electrically connected to the tongue piece part 135 of the power bus bar 131 that is exposed from the window part 55f, for example, by resistance welding or the like.

The pair of smoothing capacitors 65, 66 are provided for preventing a voltage change that occurs in accordance with the driving of the brushless motor 2. For example, the pair of smoothing capacitors 65, 66 are electrolytic capacitors having a cylindrical shape similarly to the X capacitor 62. The one smoothing capacitor 65 is arranged on the fourth arrangement part 56d, and the other smoothing capacitor 66 is arranged on the fifth arrangement part 56e. The center axial line of each of the smoothing capacitors 65, 66 is arranged along the second side 50b of the base main body 50.

Each of the pair of smoothing capacitors 65, 66 has a pair of lead wires that protrude from one end surface.

Each of front ends of the pair of lead wires in the one smoothing capacitor 65 is arranged in the window part 55h and is electrically connected to each of the tongue piece part 136 of the power bus bar 131 and the tongue piece part 145 of the ground bus bar 141 exposed from the window part 55h, for example, by resistance welding or the like.

Each of front ends of the pair of lead wires in the other smoothing capacitor 66 is arranged in the window part 55i and is electrically connected to each of the tongue piece part 133 of the power bus bar 131 and the tongue piece part 143 of the ground bus bar 141 exposed from the window part 55i, for example, by resistance welding or the like.

The resistor 67 is arranged on the sixth arrangement part 56f. The resistor 67 extends along the second side 50b of the base main body 50. For example, the resistor 67 and the diode 68 function as a current limit circuit for limiting a current that charges the smoothing capacitors 65, 66.

Both end parts of the resistor 67 are arranged in the window part 55i. One end part of the resistor 67 is electrically connected to the tongue piece part 134 of the power bus bar 131 that is exposed from the window part 55i, for example, by resistance welding or the like. The other end part of the resistor 67 is electrically connected to a tongue piece part 104a of a signal system terminal bus bar 104 that is exposed from the window part 55*i*, for example, by resistance welding or the like.

The diode 68 is arranged on a base (not shown) that is buried in the window part 55*k*. The diode 68 extends along the second side 50*b* of the base main body 50.

One end part of the diode 68 is electrically connected to a tongue piece part 104*b* of the signal system terminal bus bar 104, for example, by resistance welding or the like. The other end part of the diode 68 is electrically connected to a tongue piece part 101*b* of the signal system terminal bus bar 101 that is exposed from the window part 55*k*, for example, by resistance welding or the like.

<Power Device>

The following description refers to FIG. 5. FIG. 5 is a view of the bus bar module seen from a second surface side of the base member. The power device 7 is arranged on the power device arrangement part 57.

The power device 7 is formed in a rectangular plate shape that extends in the width direction. For example, the power device 7 is formed by embedding an integrated circuit and the like within a molded body such as an epoxy resin. For example, the integrated circuit includes an electronic element that includes a switching element such as a FET (Field-Effect Transistor) and an IGBT (Insulated-Gate Bipolar Transistor).

A terminal row 7*a* that includes a lead wire is provided on one side surface of the power device 7. Each of terminals that constitute the terminal row 7*a* is exposed in the window part 55*i* and is electrically connected to each of the power device side end parts 107, 124, 132, 142 of the bus bar 100 that are exposed from the window part 55*i*, for example, by resistance welding or the like.

<Connection Circuit>

Figure 8:
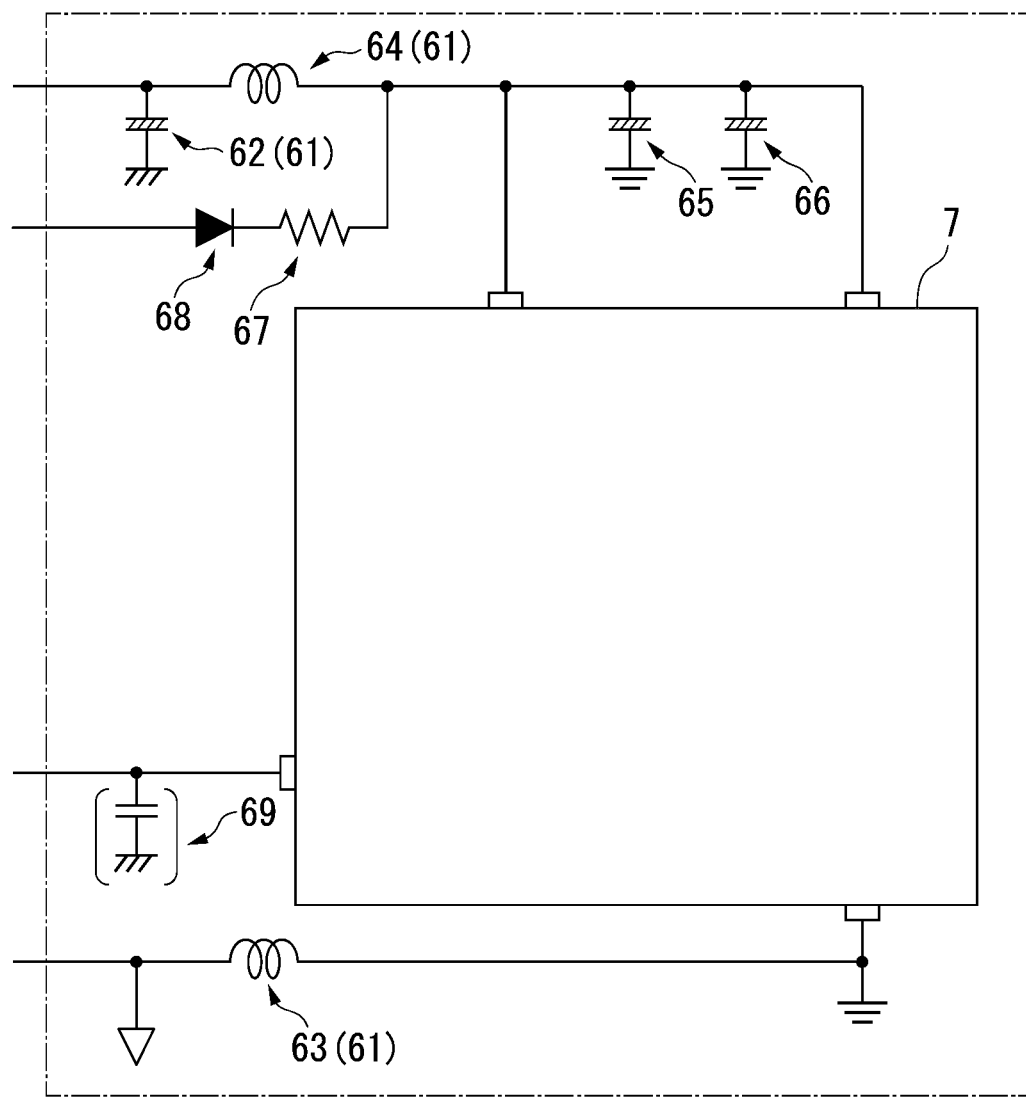
FIG. 8 is a connection circuit view of the electronic component and a power device.

The following description refers to FIG. 8. FIG. 8 is a connection circuit view of the electronic component and the power device.

The X capacitor 62, the choke coils 63, 64, the smoothing capacitors 65, 66, the resistor 67, and the diode 68 described above as the electronic elements 60 are electrically connected to the power device 7.

Reference numeral 69 in the drawing represents a capacitor for noise countermeasure such as a ceramic capacitor. In consideration of a case which requires noise countermeasure, two extension electronic component arrangement parts 50*k* are provided on a base main body rear surface (second surface side) of the power device arrangement part 57, on which the power device 7 is arranged, of the base main body 50, and it is possible to arrange the capacitor 69 (electronic component) on the space. With respect to a pair of lead wires that protrude from the electronic component which is arranged on the extension electronic component arrangement part 50*k*, one of the pair of lead wires is electrically connectable to the connection parts 105*a*, 105*b* of the signal system terminal bus bar 105 that are exposed from the window part 55*j*, and the other of the pair of lead wires is electrically connectable to each of the connection parts 102*a*, 103*a* of the signal system terminal bus bars 102, 103 that are exposed from the window part 55*j*. Another arrangement part of the capacitor 69 may be provided at a predetermined position of the bus bar 100. Thereby, when a toughness requirement that is required for the control apparatus 3 is changed, and noise countermeasure is required, by arranging the capacitor 69 on the extension electronic component arrangement part 50*k*, desired noise countermeasure is realized. Another extension electronic component arrangement part may be provided at a predetermined position of the bus bar 100 other than the base main body rear surface (second surface side) of the power device arrangement part 57.

<Floating Prevention Part>

The following description refers to FIG. 5. A floating prevention part 70 that prevents the power device 7 from floating from the power device arrangement part 57 of the base member 5 is formed on the base member 5. A latch part 71 that latches the power device 7 to the base member 5 is provided on the floating prevention part 70. A pair of latch parts 71 is provided on both sides of the power device 7 (total four latch parts 71 are provided) along the shorter side direction of the power device 7 in the vicinity of four corners of the power device 7 which form a rectangular shape that extends in the width direction in plan view.

When each of a plurality of terminal rows 7*a* of the power device 7 is electrically connected by resistance welding to each of the power device side end parts 107, 124, 132, 142 of the bus bar 100, the resistance welding is performed by causing a pair of electrodes to be in contact with a connection part from each of the penetration directions of the window part 55*i* and causing a current to flow between the pair of electrodes. At this time, a phenomenon may occur in which, by the contact pressure of the electrode, the power device 7 floats from the power device arrangement part 57 of the base member 5, and the workability of the resistance welding may be degraded. However, in the case of the present embodiment, the floating prevention part 70 is formed on the power device arrangement part 57, and therefore, it is possible to improve the workability of the resistance welding.

The embodiment is not limited to the latch part 71. A fastening member such as a bolt may be provided on the floating prevention part 70.

<Latch Part>

Figure 9:
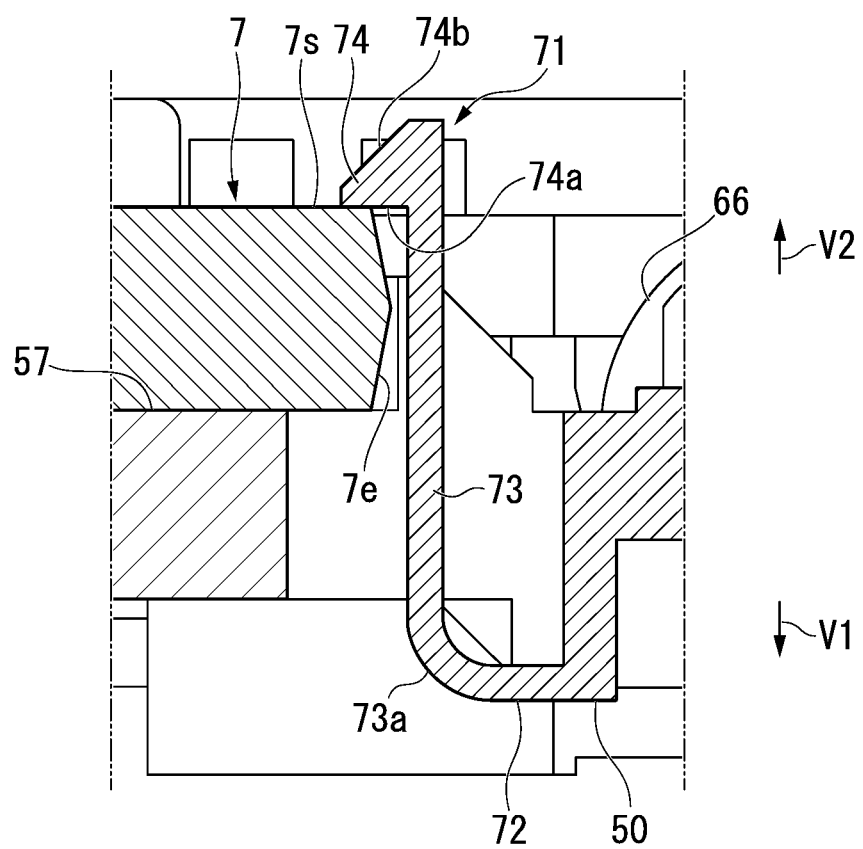
FIG. 9 is a IX-IX cross-sectional view of FIG. 5.
Figure 10:
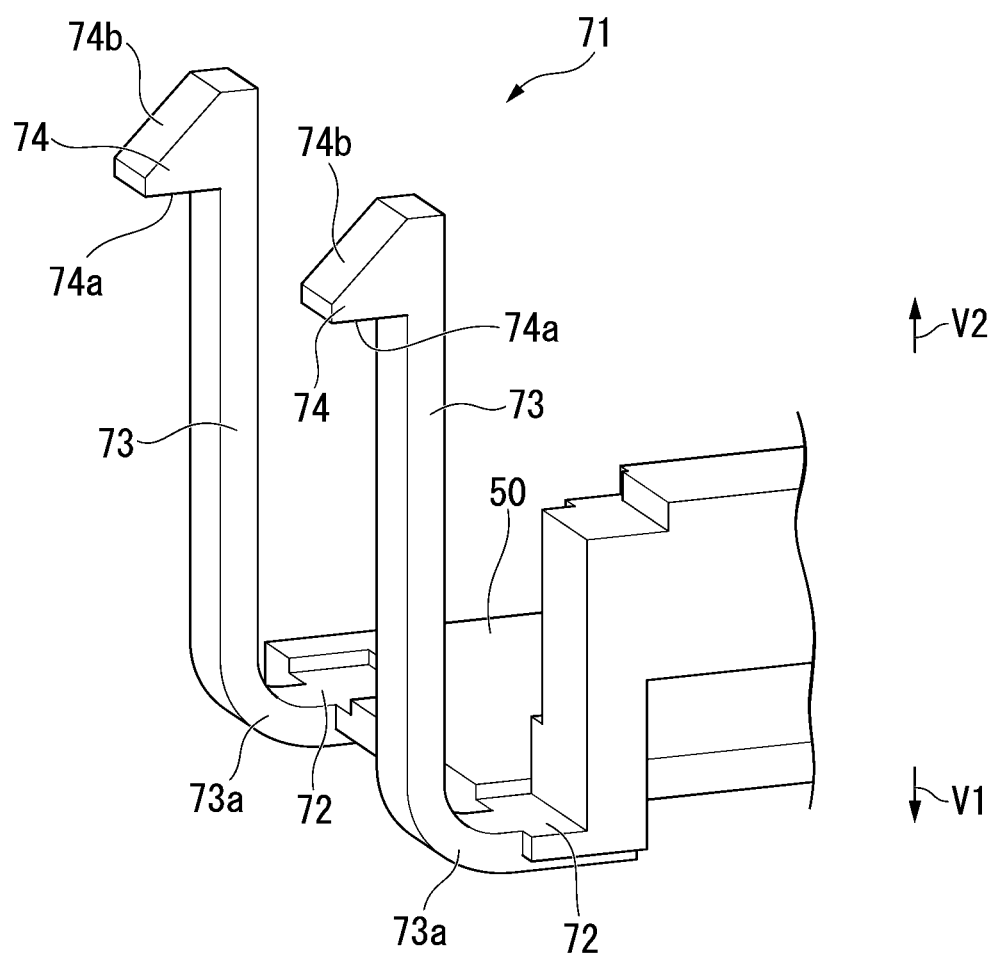
FIG. 10 is a perspective view of a latch part that latches the power device to the base member.

The following description refers to FIG. 9 and FIG. 10. FIG. 9 is a IX-IX cross-sectional view of FIG. 5. FIG. 10 is a perspective view of a latch part that latches the power device to the base member. The latch part 71 includes a base unit 72 that is provided on a first surface side of the base main body 50, a leg unit 73 that extends from the base unit 72 toward a second surface side, and a claw unit 74 that protrudes from an end portion of the leg unit 73 toward the power device 7 which is arranged on the second surface side and that latches the power device 7.

A curved portion 73*a* that is curved in an arc shape in a cross-sectional view of FIG. 9 is formed on a base end portion (a portion close to the base unit 72) of the leg unit 73.

The claw unit 74 includes a flat contact portion 74*a* that is in contact with a flat surface 7*s* (a surface on the second surface side) of the power device 7 and a taper portion 74*b* that is slanted with respect to the thickness direction in a cross-sectional view of FIG. 9.

A taper portion 7*e* that is slanted so as to form a V shape which projects outward in the width direction is formed on a side surface that faces the latch part 71 of the power device 7.

<Housing>

Figure 11:
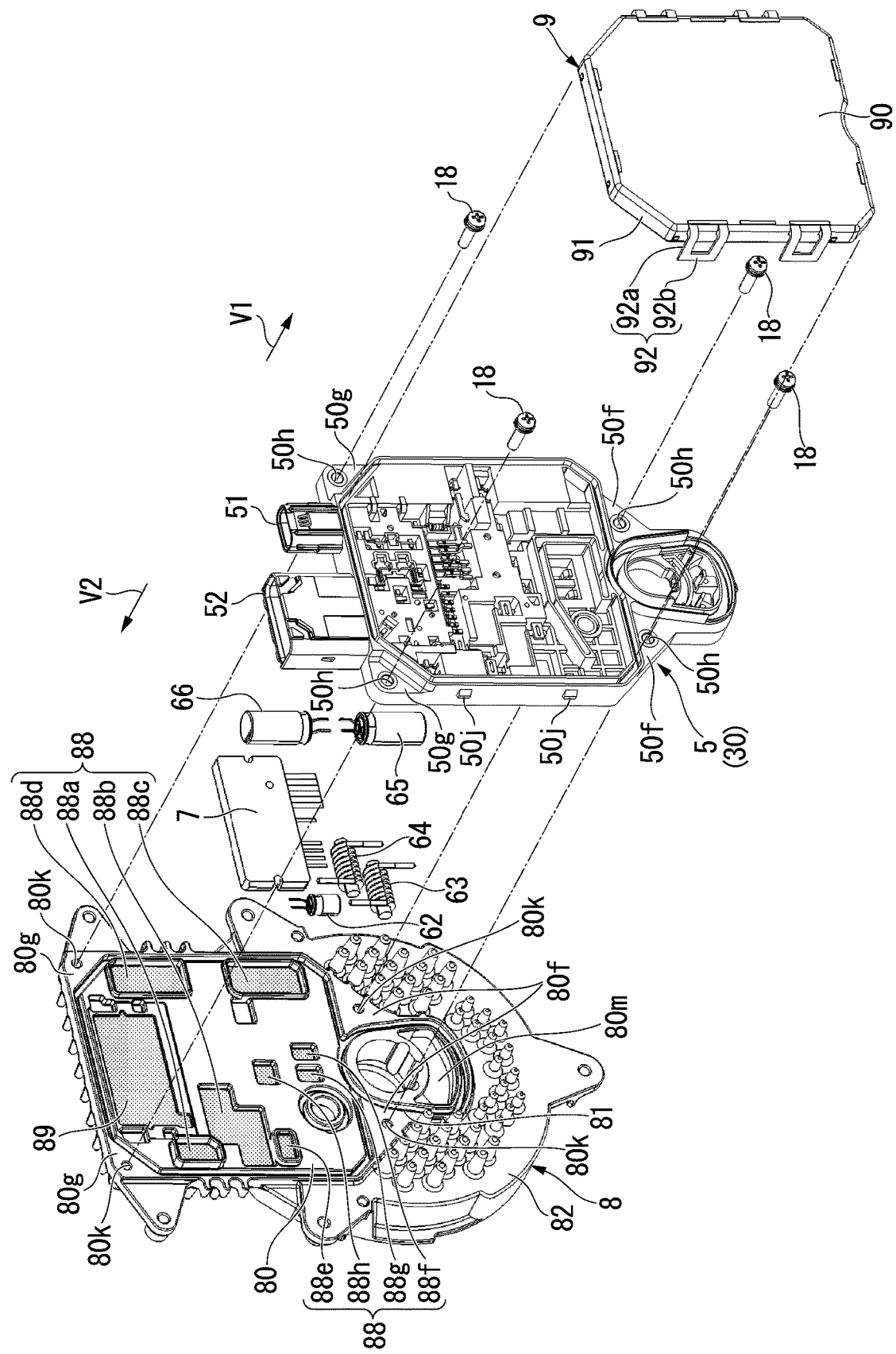
FIG. 11 is an exploded perspective view describing a thermally conductive material that is provided on a recess part of a housing in the control apparatus.
Figure 12:
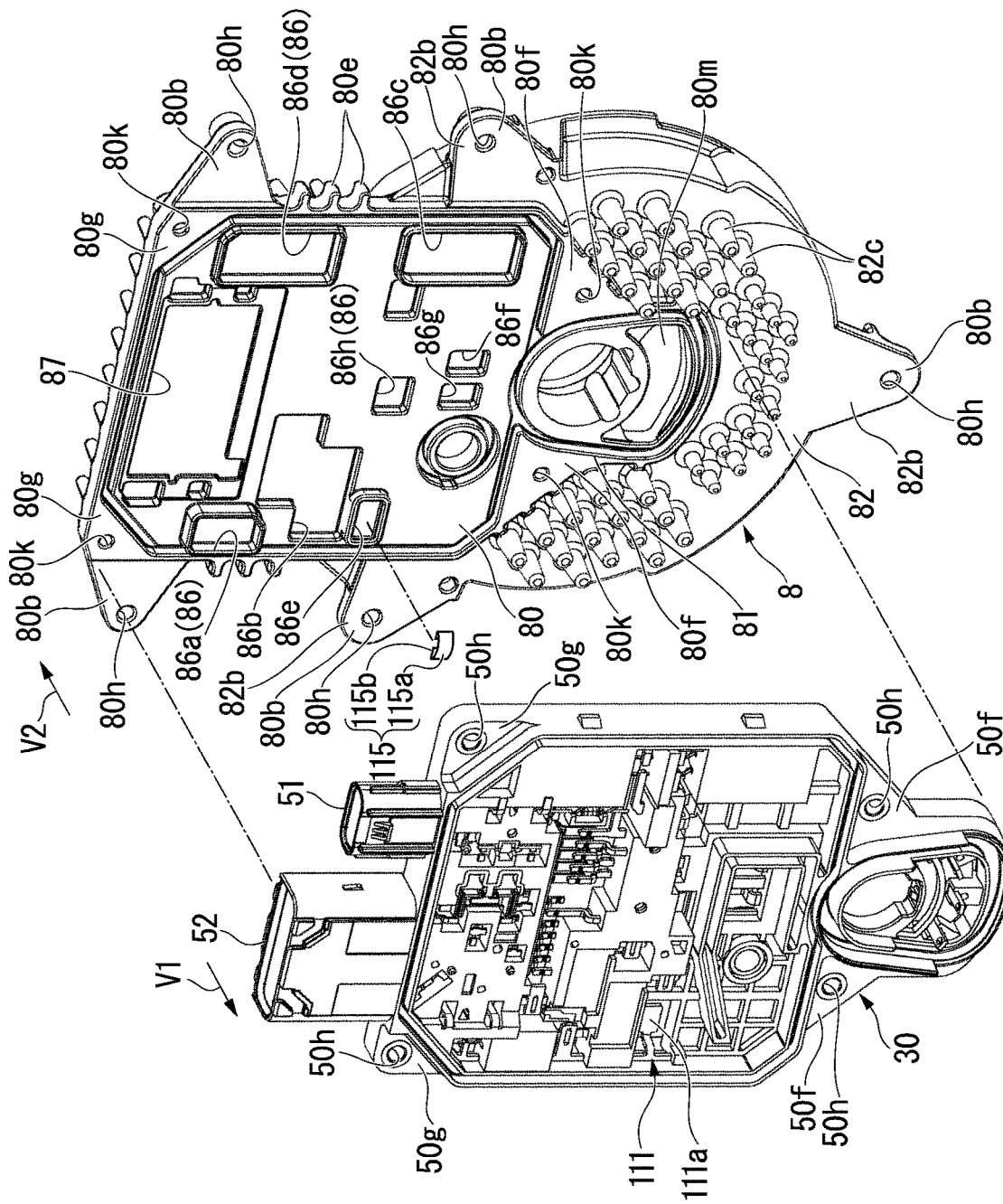
FIG. 12 is an exploded perspective view describing a connection structure between the bus bar module and a contact plate when the bus bar module is attached to the housing.

The following description refers to FIG. 11 and FIG. 12. FIG. 11 is an exploded perspective view describing a thermally conductive material that is provided on a recess part of a housing in the control apparatus. FIG. 12 is an exploded perspective view describing a connection structure between the bus bar module and a contact plate when the bus bar module is attached to the housing. The housing 8 includes a housing main body 80 having a shape along the outer shape of the base main body 50, a motor connection part 81 having a shape along the outer shape of the terminal connection part 53, and a motor bracket part 82 having a shape along the outer shape of the brushless motor 2 in the motor axial direction. For example, the housing 8 is formed of a metal material having good thermal conductivity such as aluminum.

<Housing Main Body>

The following description refers to FIG. 1 to FIG. 3. The housing main body 80 includes a main body base part 80*a* (refer to FIG. 2) having a flat surface on the other side V2 in the motor axial direction, a plurality (for example, in the present embodiment, one at each of both ends in the width direction (total two)) of flange parts 80*b* that protrude outward in the width direction from each of both end portions in the width direction of the main body base part 80*a*, a plurality of pin-type heat release fins 80*c* that protrude on a surface of the main body base part 80*a* toward the other side in the motor axial direction, a connection rib 80*d* that extends straight so as to connect between the heat release fins 80*c* that are adjacent in the vertical direction in FIG. 2, and a plurality of heat release fins 80*e* that protrude outward in the width direction from each of both end portions in the width direction of the main body base part 80*a* and that have a convex shape. A penetration hole 80*h* that opens in the motor axial direction is formed on the flange part 80*b*.

<Motor Connection Part>

An opening part 81*h* that opens in the motor axial direction is formed on the motor connection part 81. A motor connection boss portion 81*a* to which the brushless motor 2 is integrally connected is provided on a portion that faces the opening part 81*h* in the motor connection part 81.

<Motor Bracket Part>

The motor bracket part 82 (refer to FIG. 1) includes a base portion 82*a* having a flat surface on one side in the motor axial direction, a plurality (for example, in the present embodiment, three) of flange portions 82*b* that protrude outward in a motor radial direction from an outer circumference part of the base portion 82*a*, and a plurality of pin-type heat release fins 82*c* that protrude on a surface of the base portion 82*a* toward the one side V1 in the motor axial direction. A penetration hole 82*h* that opens in the motor axial direction is formed on the flange portion 82*b*.

A wall part 82*d* that is provided along the outer shape of the rotor 21 (flange part 21*d*) and that has a polygonal shape is provided between the base part 80*a* and a motor cover part 82 between the two flange portions 82*b* that are arranged at an upper position in FIG. 2.

In this way, by providing the heat release fin 80*c*, the connection rib 80*d*, the heat release fin 80*e*, and the heat release fin 82*c* on the housing main body 80, it is possible to increase the surface area of the housing main body 80, and it is possible to effectively release the heat of the control apparatus 3 and the brushless motor 2.

Further, since the connection rib 80*d* that connects between the heat release fins 80*c* that are adjacent in the vertical direction is formed on the main body base part 80*a*, and the wall part 82*d* that is provided along the outer shape of the rotor 21 (flange part 21*d*) is provided between the base part 80*a* and the motor cover part 82, rainwater that adheres to the housing main body 80 does not remain on the main body base part 80*a*, is guided downward, is further guided in a right or left direction along the wall part 82*d* in FIG. 2, and is drained from the housing main body 80, and wetting of the brushless motor 2 due to the rainwater from the above route is effectively reduced.

<Base Member Attachment Part>

The following description refers to FIG. 12. A base member attachment part 80*f* is formed on a region that faces the flange part 50*f* of the base member 5 in the motor axial direction between the housing main body 80 and the motor connection part 81.

A base member attachment part 80*g* is formed on the housing main body 80 at a region that is opposed to the flange part 50*g* of the base member 5 in the motor axial direction.

An attachment hole 80*k* that opens in the motor axial direction is formed on the base member attachment parts 80*f*, 80*g*.

For example, by inserting a bolt 18 in the through-hole 50*h* of each of the flange parts 50*f*, 50*g* of the base member 5 and screwing a bolt 18 in the attachment hole 80*k* of each of the base member attachment parts 80*f*, 80*g* of the housing 8, the base member 5 can be fastened and fixed to the housing 8.

<Main Body Cover>

The following description refers to FIG. 1 and FIG. 11. The main body cover 9 forms a rectangular shape along the outer shape of the base main body 50 seen from the motor axial direction. The main body cover 9 approaches the base main body 50 from one side of the plate thickness direction and covers the base main body 50. The "one side of the plate thickness direction" corresponds to the one side of the motor axial direction.

The main body cover 9 includes a top plate part 90 that covers the base main body 50 from one side of the plate thickness direction and a cover wall part 91 that stands toward the base main body 50 from the top plate part 90, that surrounds the base main body 50 seen from the motor axial direction, and that has a rectangular ring shape.

A latch part 92 that latches the main body cover 9 to the base main body 50 is provided on the top plate part 90. A plurality (for example, in the present embodiment, two at each of both ends in the width direction, that is, total four) of latch parts 92 are provided on both end portions in the width direction of the top plate part 90.

The latch part 92 includes a pair of leg units 92*a* that extend from the top plate part 90 toward the base main body 50 and a connection unit 92*b* that connects end portions of the pair of leg units 92*a*.

A claw unit 50*j* that latches the base main body 50 to the connection unit 92*b* of the latch part 92 from one side of the plate thickness direction is provided on the base main body 50. A plurality (for example, in the present embodiment, two at each of both ends in the width direction, that is, total four) of latch parts 50*j* are provided on both end portions in the width direction of the base main body 50 so as to be opposed to the latch part 92 of the main body cover 9.

<Terminal Cover>

The following description refers to FIG. 1 and FIG. 3. The terminal cover 10 forms a shape along the outer shape of the terminal connection part 53 seen from the motor axial direction. The terminal cover 10 approaches the terminal connection part 53 from one side of the plate thickness direction and covers the terminal connection part 53. The terminal cover 10 is arranged at a position that covers the motor side end part 125 of the three-phase bus bars 121 to 123 and a fastening part 20*j* of the output shaft 20. The terminal cover 10 covers and lids an electrical connection portion between the three power supply terminals 25*a* of the brushless motor 2 and a corresponding motor side end part 125. A seal material 40 having a ring shape is provided between the terminal connection part 53 and the terminal cover 10.

The terminal cover 10 includes a top plate part 11 that covers the terminal connection part 53 from one side of the plate thickness direction and a cover wall part 12 that stands toward the terminal connection part 53 from the top plate part 11, that surrounds the terminal connection part 53 seen from the plate thickness direction, and that has a ring shape.

The terminal connection part 53 includes a base wall portion 53*a* that is in contact with an outer circumferential side of the cover wall part 12 via the seal material 40 and has a ring shape.

The terminal cover 10 is attached to the terminal connection part 53 in a state where the seal material 40 is compressed in a radial direction of the cover wall part 12 and the base wall portion 53*a*.

The radial direction of the cover wall part 12 and the base wall portion 53*a* corresponds to a direction (direction to which the cover wall part 12 and the base wall portion 53*a* are opposed) that is orthogonal to the plate thickness direction.

Latch parts 13, 14 (a first latch part 13 and a second latch part 14) that latch the terminal cover 10 to the terminal connection part 53 are provided on the top plate part 11.

The first latch part 13 includes a pair of first leg units 13*a* that extend from an outer side of the top plate part 11 toward the terminal connection part 53 and a first connection unit 13*b* that connects end portions of the pair of first leg units 13*a*.

A first claw unit 53*j* that latches the terminal connection part 53 to the first connection unit 13*b* of the first latch part 13 from one side of the plate thickness direction is provided on the terminal connection part 53.

The second latch part 14 includes a pair of second leg units 14*a* that extend toward the terminal connection part 53 from an inner side of the top plate part 11 and a side which faces the fastening part 20*j* of the output shaft 20 and a second connection unit 14*b* that connects end portions of the pair of second leg units 14*a*.

A second claw unit 53*k* that latches the terminal connection part 53 to the second connection unit 14*b* of the second latch part 14 from one side of the plate thickness direction is provided on the terminal connection part 53.

<Recess Part>

The following description refers to FIG. 11 and FIG. 12. A plurality of first recess parts 86 that are recessed at a position which faces part of the terminal 4 and the plurality of electronic elements 60 and a second recess part 87 that is recessed at a position which faces the power device 7 are formed on the housing main body 80.

The first recess part and the second recess part correspond to a "recess part" described in claims.

In FIG. 11, for ease of understanding, a thermally conductive material that is provided on the recess part is shown by hatching (dot).

The plurality of first recess parts 86 include an X capacitor recess part 86*a* that is recessed at a position which faces the X capacitor 62, a choke coil recess part 86*b* that is recessed at a position which faces the two choke coils 63, 64, a pair of smoothing capacitor recess parts 86*c*, 86*d*, each of which is recessed at a position that faces each of the pair of the smoothing capacitors 65, 66, a ground end recess part 86*e* that is recessed at a position which faces the ground end part 111*a* of the first power terminal bus bar 111, a pair of a V-phase recess parts 86*f* and a W-phase recess part 86*g* that is recessed at a position which faces a pair of tongue piece parts 126 of the three-phase bus bars 121 to 123, and a U-phase recess part 86*h* that is recessed at a position which faces the tongue piece part 127 of the three-phase bus bars 121 to 123.

The X capacitor 62, the two choke coils 63, 64, and the pair of the smoothing capacitors 65, 66 have a higher heat emission property than those of the resistor 67 and the diode 68.

The X capacitor 62, the two choke coils 63, 64, and the pair of the smoothing capacitors 65, 66 among the plurality of electronic elements 60 correspond to a "second electronic element" described in claims. The resistor 67 and the diode 68 among the plurality of electronic elements 60 correspond to a "first electronic element" described in claims.

<Thermally Conductive Material>

A first thermally conductive material 88 is filled in the first recess part 86, and a second thermally conductive material 89 is filled in the second recess part 87. The first thermally conductive material 88 and the second thermally conductive material 89 have a higher thermal conductivity than that of the base member 5. For example, an epoxy adhesive to which an aluminum filler is mixed is used for the first thermally conductive material 88 and the second thermally conductive material 89. The housing 8 is fixed to the base member 5 via the first thermally conductive material 88 that is provided on the first recess parts 86 and the second thermally conductive material 89 that is provided on the second recess part 87.

The first thermally conductive material 88 and the second thermally conductive material 89 correspond to a "thermally conductive material" described in claims.

The plurality of first thermally conductive materials 88 include an X capacitor thermally conductive material 88*a* that is provided on the X capacitor recess part 86*a*, a choke coil thermally conductive material 88*b* that is provided on the choke coil recess part 86*b*, a pair of smoothing capacitor thermally conductive materials 88*c*, 88*d*, each of which is provided on each of the pair of smoothing capacitor recess parts 86*c*, 86*d*, a ground end thermally conductive material 88*e* that is provided on the ground end recess part 86*e*, a pair of a V-phase thermally conductive material 88*f* and a W-phase thermally conductive material 88*g*, each of which is provided on each of the pair of the V-phase recess part 86*f* and the W-phase recess part 86*g*, and a U-phase thermally conductive material 88*h* that is provided on the U-phase recess part 86*h*.

The thickness of the X capacitor thermally conductive material 88*a* is, for example, a value in a range of 2.80 mm to 3.50 mm and, in the present embodiment, is 3.15 mm.

The thickness of the choke coil thermally conductive material 88*b* is, for example, a value in a range of 2.60 mm to 2.80 mm and, in the present embodiment, is 2.70 mm.

Each thickness of the pair of smoothing capacitor thermally conductive materials 88*c*, 88*d* is, for example, a value in a range of 2.30 mm to 2.40 mm and, in the present embodiment, is 2.35 mm.

The thickness of the ground end thermally conductive material 88*e* is, for example, a value in a range of 1.83 mm to 3.15 mm and, in the present embodiment, is 2.49 mm.

Each thickness of the pair of the V-phase thermally conductive material 88*f* and the W-phase thermally conductive material 88*g* is, for example, a value in a range of 1.70 mm to 3.24 mm and, in the present embodiment, is 2.47 mm.

The thickness of the U-phase thermally conductive material 88*h* is, for example, a value in a range of 1.70 mm to 2.82 mm and, in the present embodiment, is 2.26 mm.

The thickness of the second thermally conductive material 89 used for the power device 7 is, for example, a value in a range of 0.65 mm to 1.65 mm and, in the present embodiment, is 1.15 mm.

In this way, by specifying the thickness of the first thermally conductive material 88 and the second thermally conductive material 89 for each of the electronic components 60 and the power device 7, it is possible to ensure an insulation property suitable for each of the electronic components 60 and the power device 7.

Another material that has an excellent heat release property such as a silicone adhesive may be used for the thermally conductive materials 88, 89.

A resin material such as a PBT (polybutylene terephthalate) may be used for the thermally conductive materials 88, 89. Thereby, it is possible to provide an excellent insulation property.

The thermally conductive materials 88, 89 may have an excellent wetting spread property and an excellent adhesion property with respect to the surface of the recess part, the electronic element, and the like. Thereby, it is possible to prevent the adhesive from being removed from the recess part and the electronic element, and therefore, it is possible to ensure an excellent anti-vibration property and an excellent heat release property.

A heat release sheet and a fixation adhesive may be combined for the thermally conductive materials 88, 89. A heat release gel and a fixation adhesive may be combined for the thermally conductive materials 88, 89.

<Contact Plate>

Figure 13:
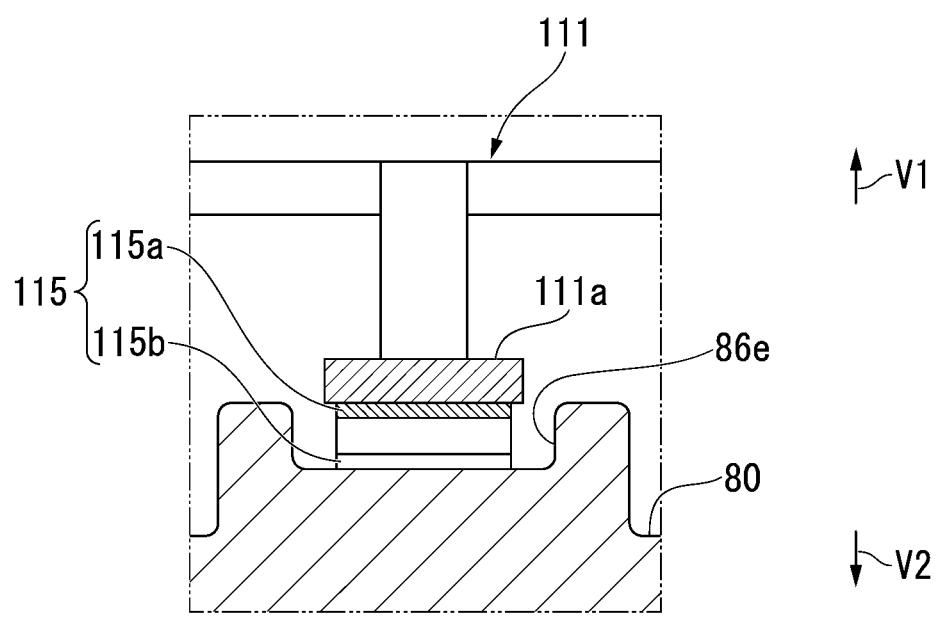
FIG. 13 is an XIII-XIII cross-sectional view of FIG. 1.

The following description refers to FIG. 12 and FIG. 13. FIG. 13 is an XIII-XIII cross-sectional view of FIG. 1. When the bus bar module 30 is attached to the housing 8, the bus bar module 30 is attached to the housing 8 in a state where a contact plate 115 is arranged on the ground end recess part 86e.

An electrically conductive and elastically deformable member is used for the contact plate 115. For example, the contact plate 115 is formed by a bend process of a metal piece such as copper.

The contact plate 115 includes an elastically deformable part 115a that is curved to form a convex shape toward the bus bar module 30 and a pair of support pieces 115b that extend inward in the width direction from an outer end in the width direction of the elastically deformable part 115a.

The contact plate 115 is arranged on the ground end recess part 86e in a state where the elastically deformable part 115a is directed toward the bus bar module 30. In this state, when the bus bar module 30 is attached to the housing 8, the elastically deformable part 115a is elastically deformed by coming into contact with the ground end part 111a of the first power terminal bus bar 111 and is deformed in a direction along the motor axial direction.

Thereby, it is possible to electrically connect the ground end part 111a to the housing 8 by a spring force of the contact plate 115. For example, as another ground connection method, a method in which the bus bar is fastened and fixed by a screw is known; however, there is a possibility that a stress due to the fastening of the screw and a stress due to a cold impact are applied to the bus bar. On the other hand, according to the present embodiment, the fastening of the screw is not necessary, and therefore, it is possible to exclude a possibility that the stress due to the fastening of the screw is applied to the bus bar 100. Further, it is possible to absorb the stress due to the cold impact by the elastic deformation of the elastically deformable part 115a, and therefore, it is also possible to exclude a possibility that the stress due to the cold impact is applied to the bus bar 100.

As described above, the above embodiment is the control apparatus 3 including the terminal 4 that includes the plurality of bus bars 100, the base member 5 on which the terminal 4 is provided, and the electronic component 6 that includes the plurality of electronic elements 60 which are electrically connected to the terminal 4, wherein the window part 55 from which part of the terminal 4 is exposed is formed on the base member 5 so as to penetrate in the thickness direction of the base member 5, and the extension electronic component arrangement part 50k is provided on the base member 5, and wherein the electronic component 6 is electrically connected to the terminal 4 that is exposed from the window part 55, and the electronic component 69 is electrically connectable selectively between the plurality of bus bars 100 by the extension electronic component arrangement part 50k.

According to this configuration, the window part 55 from which part of the terminal 4 is exposed is formed on the base member 5 on which the terminal 4 is provided. Therefore, it is possible to connect the electronic component 6 selectively to the predetermined terminal 4 that is exposed from the window part 55. Further, the electronic component 69 is electrically connectable selectively between the plurality of bus bars 100 by the extension electronic component arrangement part 50k. Therefore, it is possible to respond to a toughness requirement such as noise that is required for the control apparatus 3 by appropriately adding the electronic component 69, and therefore, it is possible to enhance the degree of design freedom. Further, the electronic component 6 is electrically connected to the terminal 4 that is exposed from the window part 55. Therefore, the configuration requires no circuit board, and therefore, even when specifications of a control are changed, it is not necessary to change a circuit board for each of the specifications compared to a case where a circuit board is provided. Accordingly, it is possible to reduce component costs. Further, the window part 55 is formed so as to penetrate in the thickness direction of the base member 5. Therefore, a connection apparatus such as a resistance welder is easily inserted through the window part 55, and therefore, even when the rate occupied by a connection step between the terminal 4 and the electronic component 6 among all process steps is large, it is possible to shorten a process time. Accordingly, it is possible to reduce component costs and shorten a process time while enhancing the degree of design freedom.

Further, in the embodiment described above, the electronic component 6 is electrically connected to the first terminal that is exposed from the first window part, and the power device 7 is electrically connected to the second terminal that is exposed from the second window part. Therefore, it is possible to arrange the electronic component 6 and the power device 7 collectively, and therefore, it is possible to effectively reduce component costs and shorten a process time while enhancing the degree of design freedom.

Further, in the embodiment described above, the noise prevention element 61 is selectively connectable to the first power terminal bus bar 111 (ground terminal). Therefore, it is possible to arrange the noise prevention element 61 depending on the specification, and therefore, even when a countermeasure against noise is required, it is possible to satisfy the noise requirement.

Further, in the embodiment described above, the electronic component 6 is joined by welding to the terminal 4 that is exposed from the window part 55. Therefore, it is possible to effectively shorten a process time compared to a case where the electronic component 6 is soldered.

Further, in the embodiment described above, the floating prevention part 70 that prevents the power device 7 from floating from the base member 5 is provided on the base member 5. Therefore, it is possible to securely fix the power device 7 to the base member 5. For example, even when the power device 7 is joined by welding to the second terminal that is exposed from the second window part, it is possible to prevent the power device 7 from floating from the base member 5.

Further, in the embodiment described above, the latch part 71 that latches the power device 7 to the base member 5 is provided on the base member 5. Therefore, compared to a case where a fastening member such as a bolt is used, it is possible to easily latch the power device 7 to the base member 5, and therefore, it is possible to reduce man-hours for attachment.

Further, in the embodiment described above, the latch part 71 includes the base unit 72 that is provided on the first surface side of the base member 5, the leg unit 73 that extends from the base unit 72 toward the second surface side of the base member 5, and the claw unit 74 that protrudes from the end portion of the leg unit 73 toward the power device 7 arranged on the second surface side and that latches the power device 7. Therefore, by hanging the claw unit 74 on the power device 7 while using deflection of the leg unit 73, it is possible to easily latch the power device 7 to the base member 5. Further, the leg unit 73 extends from the base unit 72 on the first surface side of the base member 5 toward the second surface side, and thereby, it is possible to sufficiently ensure the length of the leg unit 73 by using the thickness of the base member 5. Accordingly, it is possible to effectively carry out the operation of deflection of the leg unit 73.

Further, the curved portion 73a is formed on the base end portion of the leg unit 73. Therefore, it is possible to effectively carry out the operation of deflection of the leg unit 73 by using the curved portion 73a.

Further, the claw unit 74 includes the flat contact portion 74a that is in contact with the flat surface 7s of the power device 7. Therefore, it is possible to allow the flat contact portion 74a of the claw unit 74 to be in contact with the flat surface 7s of the power device 7, and therefore, it is possible to stably latch the power device 7 to the base member 5.

Further, the claw unit 74 includes the taper portion 74b that is slanted with respect to the thickness direction. Therefore, it is possible to allow the side surface of the power device 7 to slide along the taper portion 74b of the claw unit 74. Therefore, it is possible to easily latch the power device 7 to the base member 5, and it is possible to effectively carry out the operation of deflection of the leg unit 73.

Further, the taper portion 7e that is slanted so as to form a V shape which projects outward in the width direction is formed on a side surface that faces the latch part 71 of the power device 7. Therefore, it is possible to allow the side surface of the power device 7 to slide along the taper portion 7e. Therefore, it is possible to further easily latch the power device 7 to the base member 5, and it is possible to further effectively carry out the operation of deflection of the leg unit 73.

Further, in the embodiment described above, the housing 8 that is attached to the base member 5 and that has a higher thermal conductivity than that of the base member 5 is further included. Therefore, it is possible to enhance a heat release property by a simple configuration compared to a case where a cooling apparatus is separately provided.

Further, in the embodiment described above, the recess part that is recessed at a position which faces at least the second electronic element is formed on the housing 8, and the housing 8 is fixed to the base member 5 via the thermally conductive material that is provided on the recess part. Therefore, even when the second electronic element excessively emits heat, it is possible to effectively release the heat from the second electronic element.

Further, in the embodiment described above, the recess part includes the first recess part 86 that is recessed at a position which faces at least the second electronic element and the second recess part 87 that is recessed at a position which faces the power device 7, and the thermally conductive material includes the first thermally conductive material 88 that is provided on the first recess part 86 and the second thermally conductive material 89 that is provided on the second recess part 87. Therefore, even when the second electronic element and the power device 7 excessively emit heat, it is possible to effectively release the heat from the second electronic element and the power device 7.

Further, in the embodiment described above, the housing 8 includes the motor connection part 81 to which the brushless motor 2 as the driven body is integrally connected. Therefore, it is possible to reduce component costs and shorten a process time while enhancing the degree of design freedom in a configuration in which the control apparatus 3 and the brushless motor 2 are integrated.

The technical scope of the invention is not limited to the embodiment described above, and a variety of changes can be made without departing from the scope of the present invention.

In the embodiment described above, the bus bar 100 is connected to the electronic component 6 and the power device 7 by resistance welding. However, the embodiment is not limited thereto. For example, the connection may be performed by laser welding, arc welding such as TIG welding, and the like.

The material, shape, and the like of the base member 5, the housing 8, the main body cover 9, the terminal cover 10, the brushless motor 2, the bus bar 100, and the like are not limited to the material, shape, and the like of the embodiment described above. For example, the bus bar 100 may be formed of aluminum. The housing 8 may be formed of a metal material such as iron (carbon steel).

The configuration elements in the embodiment described above can be appropriately replaced by known configuration elements without departing from the scope of the present invention.

DESCRIPTION OF THE REFERENCE SYMBOLS 2 brushless motor (driven body, motor)
3 control apparatus
4 terminal
5 base member
6 electronic component
7 power device
8 housing
55 window part
55d window part (ground window part)
55k extension electronic component arrangement part
60 electronic element
61 noise prevention element
69 capacitor (electronic component)
70 floating prevention part
71 latch part 72 base unit
73 leg unit
74 claw unit
81 motor connection part
86 first recess part (recess part)
87 second recess part (recess part)
88 first thermally conductive material (thermally conductive material)
89 second thermally conductive material (thermally conductive material)
100 bus bar (electrically conductive plate material)
111 first power terminal bus bar (ground terminal)
111a ground end part (ground end terminal)

The invention claimed is:

1. A control apparatus, comprising
a terminal that includes a plurality of electrically conductive plate materials,
a base member on which the terminal is provided,
an electronic component that includes a plurality of electronic elements which are electrically connected to the terminal,
a power device that supplies electric power to a driven body and that controls driving of the driven body, and
a first connector used for a control signal that controls driving of the driven body, wherein
a window part from which a part of the terminal is exposed is formed on the base member so as to penetrate in a thickness direction of the base member, and
an extension electronic component arrangement part is provided in the vicinity of the power device and the first connecter used for a control signal on the base member, and wherein
the electronic component is electrically connected to the part of the terminal that is exposed from the window part and is electrically connectable selectively between a first electrically conductive plate material and a second electrically conductive plate material of the terminal by the extension electronic component arrangement part.

2. The control apparatus according to claim 1, wherein
the terminal comprises a first terminal to which the electronic component is electrically connected and a second terminal to which the power device is electrically connected,
the window part comprises a first window part from which part of the first terminal is exposed and a second window part from which part of the second terminal is exposed,
the electronic component is electrically connected to the first terminal that is exposed from the first window part, and
the power device is electrically connected to the second terminal that is exposed from the second window part.

3. The control apparatus according to claim 2, wherein
the first terminal comprises a ground terminal having a ground end terminal,
the first window part comprises a ground window part from which the ground end terminal is exposed, and
a noise prevention element is selectively connectable to the ground terminal.

4. The control apparatus according to claim 1, wherein
the electronic component is joined by welding to the terminal that is exposed from the window part.

5. The control apparatus according to claim 1,
wherein
a floating prevention part that prevents the power device from floating from the base member is provided on the base member.

6. The control apparatus according to claim 5, wherein
a latch part that latches the power device to the base member is provided on the floating prevention part.

7. The control apparatus according to claim 6, wherein
the latch part comprises
a base unit that is provided on a first surface side of the base member,
a leg unit that extends from the base unit toward a second surface side which is an opposite side of the first surface side of the base member, and
a claw unit that protrudes from an end portion of the leg unit toward the power device which is arranged on the second surface side and that latches the power device.

8. The control apparatus according to claim 1, further comprising
a housing that is attached to the base member and that has a higher thermal conductivity than that of the base member.

9. The control apparatus according to claim 8, wherein
the plurality of electronic elements comprise a first electronic element and a second electronic element having a higher heat emission property than that of the first electronic element,
a recess part that is recessed at a position which faces at least the second electronic element of the first electronic element and the second electronic element is formed on the housing,
a thermally conductive material having a higher thermal conductivity than that of the base member is provided on the recess part, and
the housing is fixed to the base member via the thermally conductive material that is provided on the recess part.

10. The control apparatus according to claim 9,
wherein
the recess part comprises a first recess part that is recessed at a position which faces at least the second electronic element of the first electronic element and the second electronic element and a second recess part that is recessed at a position which faces the power device, and
the thermally conductive material comprises a first thermally conductive material that is provided on the first recess part and a second thermally conductive material that is provided on the second recess part.

11. The control apparatus according to claim 8, wherein
the housing comprises a motor connection part to which a motor as the driven body is integrally connected.

* * * * *